US012795927B2

(12) United States Patent
Choi et al.

(10) Patent No.: US 12,795,927 B2
(45) Date of Patent: Nov. 10, 2026

(54) MEMORY DEVICE WITH SUB-SOURCE LAYER

(71) Applicant: SK hynix Inc., Gyeonggi-do (KR)

(72) Inventors: Won Geun Choi, Gyeonggi-do (KR); Jung Shik Jang, Gyeonggi-do (KR)

(73) Assignee: SK hynix Inc., Gyeonggi-do (KR)

(*) Notice: Subject to any disclaimer, the term of this patent is extended or adjusted under 35 U.S.C. 154(b) by 639 days.

(21) Appl. No.: 18/175,541

(22) Filed: Feb. 28, 2023

(65) Prior Publication Data

US 2024/0081072 A1 Mar. 7, 2024

(30) Foreign Application Priority Data

Sep. 1, 2022 (KR) ........................ 10-2022-0110871

(51) Int. Cl.
*H10B 43/35* (2023.01)
*H10B 43/27* (2023.01)

(52) U.S. Cl.
CPC ............. *H10B 43/35* (2023.02); *H10B 43/27* (2023.02)

(58) Field of Classification Search
CPC ........ H10B 53/00; H10B 53/10; H10B 53/20; H10B 53/30; H10B 53/40; H10B 53/50; H10B 41/00; H10B 41/10; H10B 41/20; H10B 41/23; H10B 41/27; H10B 41/30; H10B 41/35; H10B 41/40–44; H10B 41/46–50; H10B 41/60; H10B 41/70; H10B 43/00; H10B 43/10; H10B 43/20; H10B 43/23; H10B 43/27; H10B 43/30; H10B 43/35; H10B 43/40; H10B 43/50; H10B 51/00; H10B 51/10; H10B 51/20; H10B 51/30; H10B 51/40; H10B 51/50
See application file for complete search history.

(56) References Cited

U.S. PATENT DOCUMENTS

| | | | | |
|---|---|---|---|---|
| 10,566,348 B1 * | 2/2020 | Yeh | H10B 41/27 |
| 10,804,279 B2 | 10/2020 | Hu et al. | |
| 12,106,806 B2 * | 10/2024 | Jang | G11C 16/0433 |
| 2016/0141419 A1 * | 5/2016 | Baenninger | H10D 30/689 257/314 |
| 2020/0295036 A1 * | 9/2020 | Sotome | H01L 23/481 |

FOREIGN PATENT DOCUMENTS

| | | |
|---|---|---|
| KR | 10-2017-0026102 A | 3/2017 |
| KR | 10-2021-0010210 A | 1/2021 |
| KR | 10-2022-0087526 A | 6/2022 |

OTHER PUBLICATIONS

Office Action for Korean Patent Application No. 10-2022-0110871 issued by the Korean Patent Office on Feb. 26, 2026.

* cited by examiner

*Primary Examiner* — William B Partridge
*Assistant Examiner* — Gustavo G Ramallo
(74) *Attorney, Agent, or Firm* — IP & T GROUP LLP

(57) ABSTRACT

A memory device and a method of manufacturing the same. The memory device may include a stacked structure including a drain selection line, word lines, and a source selection line that are sequentially stacked, a main plug extending in a vertical direction of the stacked structure, and including a sub-source layer hole in a central portion of an upper area of the main plug, a separation pattern configured to separate the main plug in a vertical direction, and a source line stacked on the stacked structure, and configured to fill the sub-source layer hole.

18 Claims, 21 Drawing Sheets

MEMORY DEVICE WITH SUB-SOURCE LAYER

CROSS-REFERENCE TO RELATED APPLICATION

The present application claims priority under 35 U.S.C. § 119(a) to Korean patent application number 10-2022-0110871, filed on Sep. 1, 2022, in the Korean Intellectual Property Office, the entire disclosure of which is incorporated herein by reference.

BACKGROUND

1. Field of Invention

Various embodiments of the present disclosure relate to a memory device and a method of manufacturing the memory device, and more particularly to a three-dimensional (3D) memory device and a method of manufacturing the 3D memory device.

2. Description of Related Art

Memory devices may be classified into a volatile memory device in which stored data is lost when the supply of power is interrupted, and a nonvolatile memory device in which stored data is retained even when the supply of power is interrupted.

Examples of the nonvolatile memory device may include a NAND flash memory, a NOR flash memory, a resistive memory (or a resistive random access memory: ReRAM), a phase-change random access memory (PRAM), a magnetoresistive random access memory (MRAM), a ferroelectric random access memory (FRAM), a spin transfer torque random access memory (STT-RAM), etc.

Among the examples of the nonvolatile memory device, a NAND flash memory system may include a memory device which stores data, and a controller which controls the memory device. The memory device may include a memory cell array which stores data, and peripheral circuits which perform a program operation, a read operation or an erase operation in response to a command transmitted from the controller.

The memory cell array may include a plurality of memory blocks, each of which may include a plurality of memory cells.

As the degree of integration of a memory device increases, a memory device capable of storing a large amount of data is required, and simplification of a manufacturing process is required in order to reduce manufacturing costs.

SUMMARY

Various embodiments of the present disclosure are directed to a memory device that enables the degree of integration to be improved and a method of manufacturing the memory device.

One embodiment of the present disclosure may provide for a memory device. The memory device may include a stacked structure including a drain selection line, word lines, and a source selection line that are sequentially stacked, a main plug extending in a vertical direction of the stacked structure, and including a sub-source layer hole in a central portion of an upper area of the main plug, a separation pattern configured to separate the main plug in a vertical direction, and a source line stacked on the stacked structure, and configured to fill the sub-source layer hole.

Another embodiment of the present disclosure may provide for a method of manufacturing a memory device. The method may include forming a first stacked structure in which a drain selection line, word lines, and a source selection line are sequentially formed on a first source layer, forming a main plug by etching the first stacked structure, forming a separation pattern configured to separate the main plug, forming a second stacked structure by turning the first stacked structure such that the source selection line is disposed on an upper portion and the drain selection line is disposed in a lower portion, forming a sub-source layer hole overlapping the main plug on a top surface of the second stacked structure, and forming a source line stacked on a top surface of the second stacked structure and configured to fill the sub-source layer hole.

Another embodiment of the present disclosure may provide for a memory device. The memory device may include a stacked structure including a drain selection line, word lines, and a source selection line that are sequentially stacked; a main plug extending in a vertical direction of the stacked structure, and including a sub-source layer hole in a central portion of an upper area of the main plug; a separation pattern configured to separate the main plug in a vertical direction; a source line stacked on the stacked structure, and comprising a sub-source layer which fills the sub-source layer hole; and a blocking layer, a charge trap layer, a tunnel insulating layer, and a channel layer disposed adjacent the sub-source layer hole and extending in the vertical direction away from the sub-source layer, wherein the sub-source layer protrudes in a lateral direction dose to a bottom of the separation pattern and directly contacts the channel layer.

DETAILED DESCRIPTION

Specific structural or functional descriptions in the embodiments of the present disclosure introduced in this specification or application are provided as examples to describe embodiments according to the concept of the present disclosure. The embodiments according to the concept of the present disclosure may be practiced in various forms, and should not be construed as being limited to the embodiments described in the specification or application.

Figure 1:
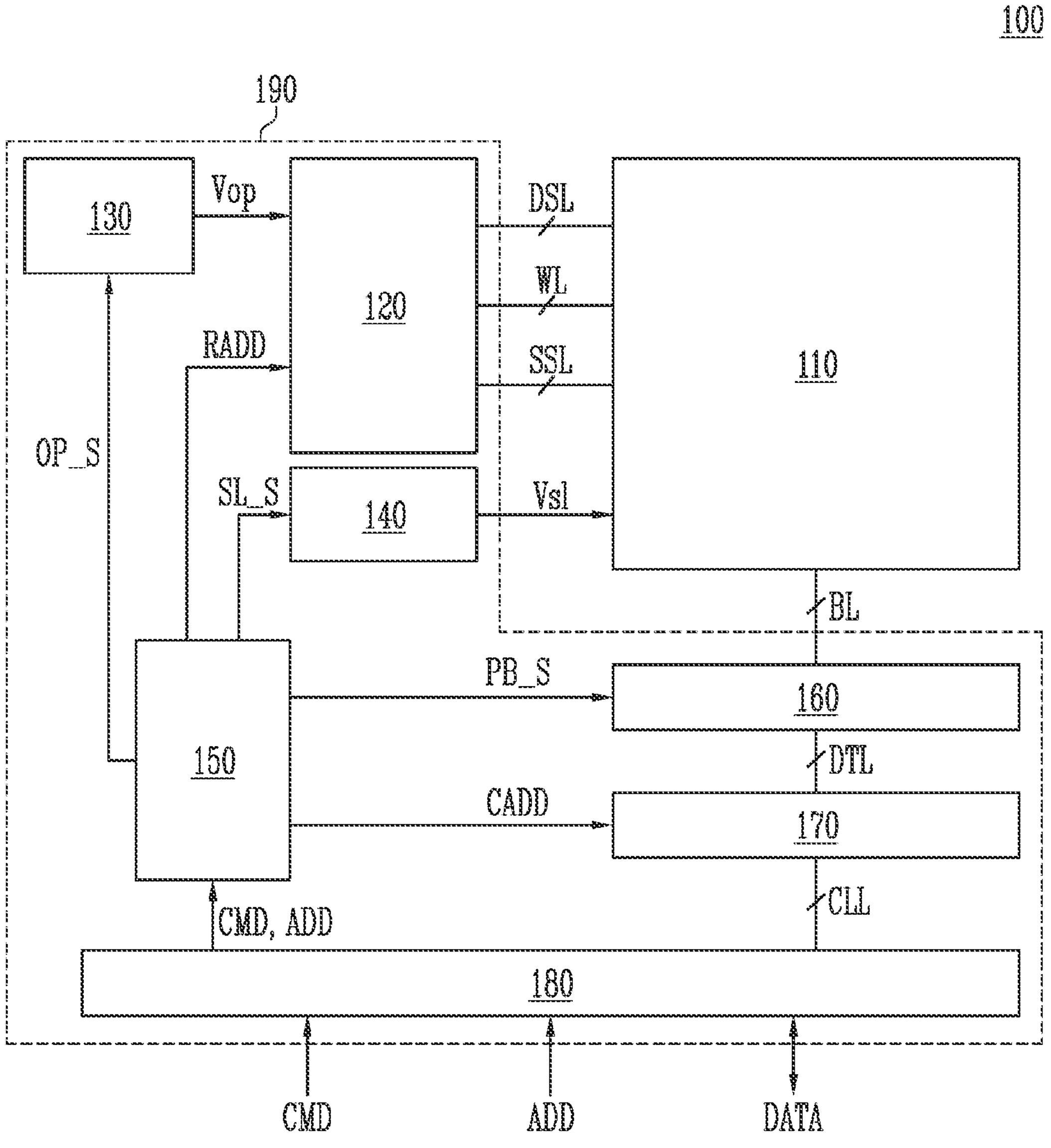
FIG. 1 is a diagram illustrating a memory device according to one embodiment of the present disclosure.

FIG. 1 is a diagram illustrating a memory device according to one embodiment of the present disclosure.

Referring to FIG. 1, a memory device 100 may include a peripheral circuit 190 and a memory cell array 110.

The peripheral circuit 190 may perform a program operation of storing data in the memory cell array 110 and a verify operation, perform a read operation of outputting data stored in the memory cell array 110, and/or perform an erase operation of erasing data stored in the memory cell array 110. The peripheral circuit 190 may include a voltage generation circuit 130, a row decoder 120, a source line driver 140, a control circuit 150, a page buffer 160, a column decoder 170, and an input-output circuit 180.

The memory cell array 110 may include a plurality of memory cells in which data is stored. In an embodiment, the memory cell array 110 may include a three-dimensional (3D) memory cell array. Each of the plurality of memory cells may store single-bit data or multi-bit data of two or more bits depending on the program scheme. The plurality of memory cells may form a plurality of strings, Memory cells included in each of the strings may be electrically connected to each other through channels, Channels included in the strings may be coupled to the page buffer 160 through bit lines BL.

The voltage generation circuit 130 may generate various operating voltages Vop to be used in program, read, and erase operations in response to an operation signal OP_S. For example, the voltage generation circuit 130 may selectively generate and output operating voltages Vop including a program voltage, a verify voltage, a pass voltage, a read voltage, an erase voltage, etc.

The row decoder 120 may be coupled to the memory cell array 110 through a plurality of drain selection lines DSL, a plurality of word lines WL, and a plurality of source selection lines SSL. The row decoder 120 may transfer the operating voltages Vop to the plurality of drain selection lines DSL, the plurality of word lines WL, and the plurality of source selection lines SSL in response to a row address RADD.

The source line driver 140 may transmit a source voltage Vsl to the memory cell array 110 in response to a source line control signal SL_S. For example, the source voltage Vsl may be transferred to a source line coupled to the memory cell array 110.

The control circuit 150 may output the operation signal OP_S, the row address RADD, the source line control signal SL_S, a page buffer control signal PB_S, and a column address CADD in response to a a command CMD and an address ADD.

The page buffer 160 may be coupled to the memory cell array 110 through the bit lines BL. The page buffer 160 may temporarily store data DATA received through the plurality of bits lines BL in response to the page buffer control signal PB_S. The page buffer 160 may sense the voltages or currents of the plurality of bit lines BL during a read operation.

The column decoder 170 may transmit data DATA received from the input-output circuit 180 to the page buffer 160 or transmit data DATA stored in the page buffer 160 to the input-output circuit 180 in response to the column address CADD. The column decoder 170 may exchange the data DATA with the input-output circuit 180 through column lines CLL, and may exchange data DATA with the page buffer 160 through data lines DTL.

The input-output circuit 180 may transfer a command CMD and an address ADD, received from an external device (e.g., a controller) coupled to the memory device 100, to the control circuit 150, and may output data, received from the column decoder 170, to the external device.

Figure 2:
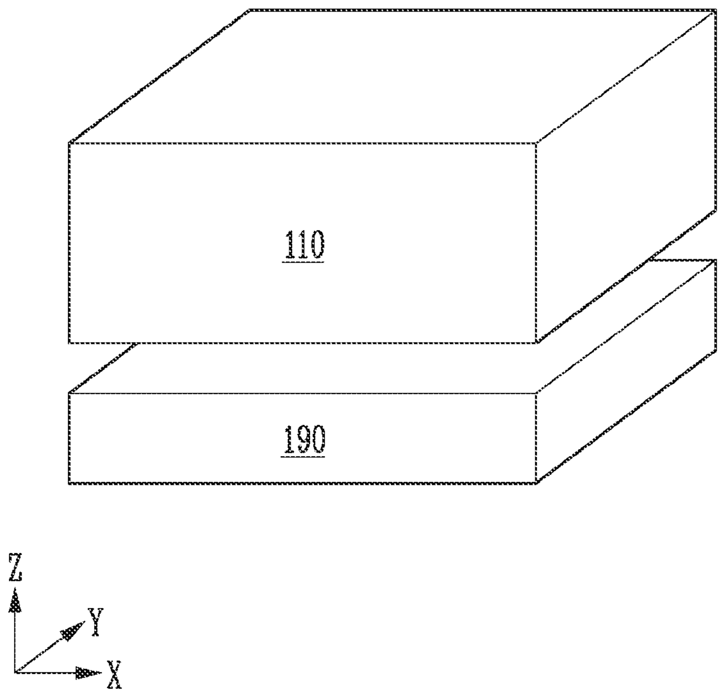
FIG. 2 is a diagram illustrating an arrangement structure of a memory cell array and a peripheral circuit.

FIG. 2 is a diagram illustrating an arrangement structure of a memory cell array and a peripheral circuit.

Referring to FIG. 2, a memory cell array 110 may be stacked on a peripheral circuit 190, For example, when a substrate is formed along an X-Y plane, the peripheral circuit 190 may be stacked in a Z direction from the substrate, and the memory cell array 110 may be stacked on the peripheral circuit 190.

Figure 3:
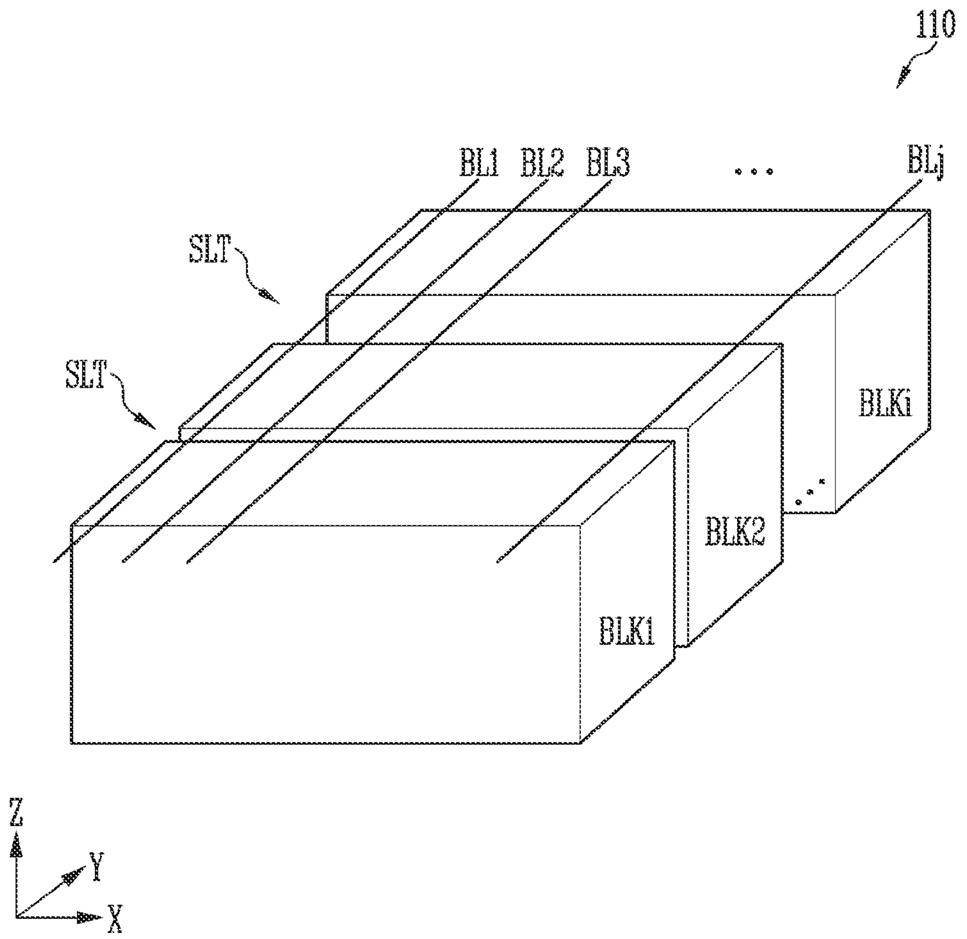
FIG. 3 is a diagram illustrating the structure of a memory cell array.

FIG. 3 is a diagram illustrating the structure of a memory cell array.

Referring to FIG. 3, the memory cell array 110 may include first to i-th memory blocks BLK1 to BLKi (where i is a positive integer). The first to i-th memory blocks BLK1 to BLKi may be arranged to be spaced apart from each other in a Y direction, and may be coupled in common to first to j-th bit lines BL1 to BLj. For example, the first to j-th bit lines BL1 to BLj may extend in the Y direction, and may be arranged to be spaced apart from each other in an X direction. The first to i-th memory blocks BLK1 to BLKi may be separated from each other by slits SLT.

Figure 4:
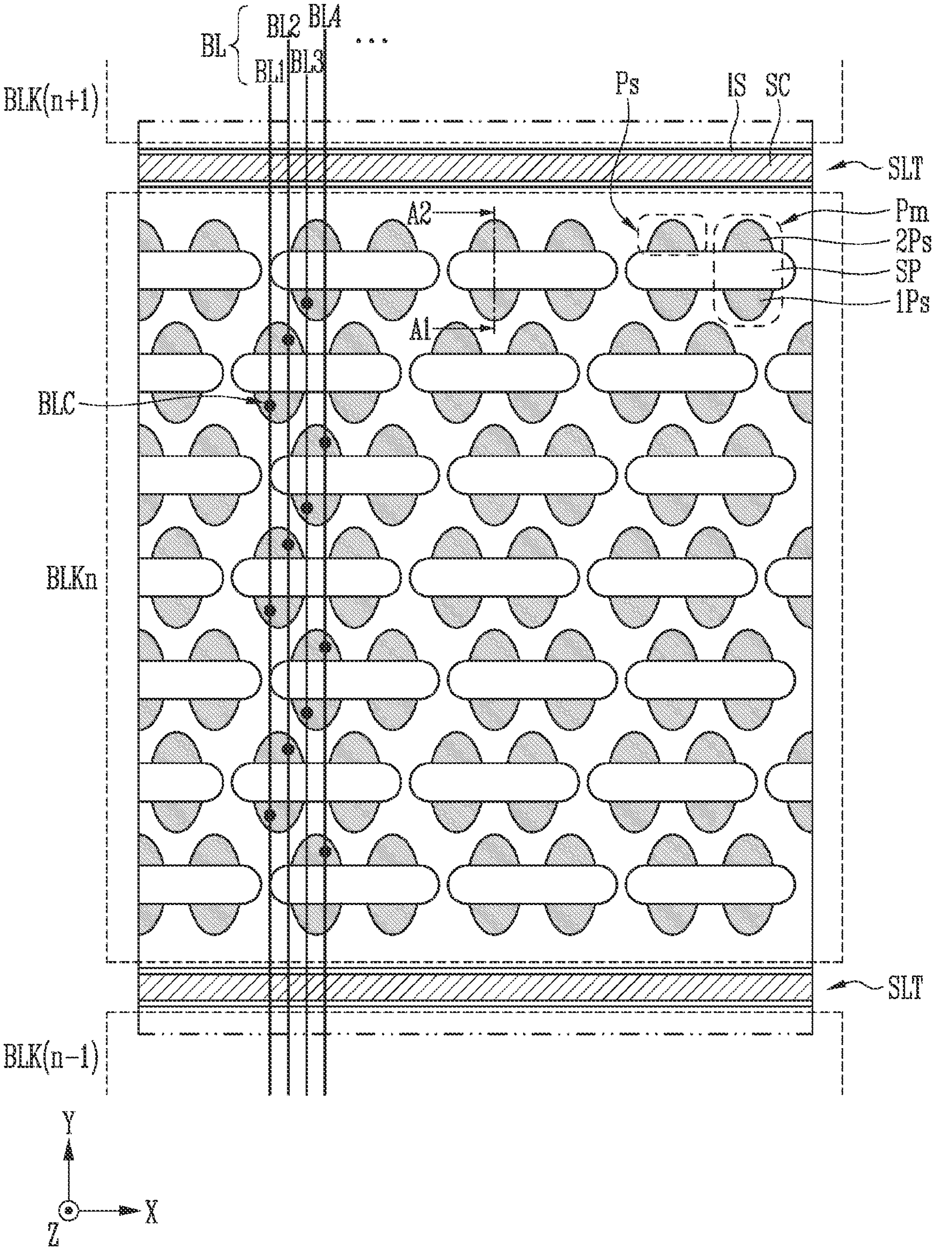
FIG. 4 is a view illustrating the layout of a memory device according to another embodiment of the present disclosure.

FIG. 4 is a view illustrating the layout of a memory device according to another embodiment of the present disclosure.

FIG. 4 is a diagram illustrating the layout of a memory device before a source line is formed.

Referring to FIG. 4, a (n−1)-th memory block BLK(n−1), an n-th memory block BLKn, and a (n+1)-th memory block BLK(n+1), which are included in the memory device, may be arranged to be spaced apart from each other in a Y direction. The (n−1)-th memory block BLK(n−1), the n-th memory block BLKn, and the (n+1)-th memory block BLK(n+1) may have same components and structures, and may be separated from each other by slits SLT.

Each of the slits SLT may include a slit isolation layer IS and a source contact SC. The slit isolation layer IS may electrically isolate memory blocks. The source contact SC may contact a source line formed in a lower portion of the memory blocks, and may transfer a source line voltage generated by a voltage generation circuit 130 to the source line.

Because the (n−1)-th memory block BLK(n−1), the n-th memory block BLKn, and the (n+1)-th memory block BLK(n+1) may be configured in the same manner, the n-th memory block BLKn will be described in detail by way of example.

The n-th memory block BLKn may include a plurality of main plugs Pm.

Referring to the layout of FIG. 4, the plurality of main plugs Pm may be arranged in a plurality of rows, and the main plugs Pm arranged in the plurality of rows may include main plugs arranged in a first row and main plugs Pm arranged in a second row disposed to be spaced apart from the first row in a Y direction. The main plugs Pm arranged in the second row may be spaced apart from the main plugs Pm arranged in the first row in a diagonal direction.

The n-th memory block BLKn may include a plurality of separation patterns SR The separation patterns SP lay overlap the main plugs Pm. Each main plug Pm may be separated into a plurality of sub-plugs Ps by the corresponding separation pattern SP, and each of the sub-plugs Ps may include a memory cell. The main plugs Pm may be formed such that two main plugs are paired and a pair of two main blocks is separated into four sub-plugs Ps by one separation pattern SR Therefore, the separation pattern SP may be formed in a shape having a major axis in an X direction and a minor axis in a Y direction so as to separate a plurality of main plugs Pm arranged in the X direction. However, since the separation pattern SP may also be formed to separate one main plug Pm, the shape of each separation pattern SP is not limited to the shape having a major axis in the X direction. The shape of the separation patterns SP is not limited to that illustrated in the drawing. For example, each separation pattern SP may be formed in a circular shape, an elliptical shape, or a rectangular shape.

Since the separation patterns SP are intended to separate the plurality of main plugs Pm arranged in a plurality of rows, the separation patterns SP may also be arranged in a plurality of rows spaced apart from each other in the Y direction. Because the main plugs Pm in the second row may be disposed to neighbor the main plugs Pm in the first row while being spaced apart from the main plugs in the first row in a diagonal direction, the separation patterns SP in the second row may be disposed to neighbor the separation patterns in the first row while being spaced apart from the separation patterns SP in the first row in the diagonal direction.

Although, in FIG. 4, two main plugs Pm spaced apart from each other are illustrated as being separated into four sub-plugs Ps by one separation pattern SP, the number of main plugs Pm separated by one separation pattern SP is not limited to that illustrated in the drawing. For example, one main plug Pm may be separated into two sub-plugs Ps by one separation pattern SP, and three main plugs Pm may be separated into six sub-plugs Ps by one separation pattern SR In another embodiment which will be described below, the structure in which two main plugs Pm are separated into four sub-plugs Ps by one separation pattern SP is explained.

The sub-plugs Ps may include a first sub-plug 1Ps and a second sub-plug 2Ps. In FIG. 4, for convenience of description, first to fourth bit lines BL1, BL2, BL3, and BL4, among a plurality of bit lines of a memory device, are illustrated, and illustration of some bit lines arranged on both sides of the first to fourth bit lines BL1, BL2, BL3, and BL4 is omitted. The first to fourth bit lines BL1, BL2, BL3, and BL4 may be coupled to sub-plugs Ps, respectively, included in main plugs Pm in first and second columns. Respective sub-plugs Ps may be coupled to bit lines corresponding thereto, among the plurality of bit lines, through bit line contacts BLC. For example, first and second sub-plugs 1Ps and 2Ps included in the main plugs Pm arranged in a Y direction and located in a first column, among the main plugs Pm, may be coupled to the first and second bit lines BL1 and BL2 through the bit line contacts BLC, Also, first and second sub-plugs 1Ps and 2Ps included in main plugs Pm disposed in a second column, which are disposed to neighbor the main plugs located in the first column and spaced apart therefrom in a diagonal direction, may be coupled to the third and fourth bit lines BL3 and BL4 through the corresponding bit line contacts BLC.

An n-th memory block BLKn may include source selection lines, word lines, and drain selection lines, which are stacked. For example, the word lines may be formed on the source selection lines, and the drain selection lines may be formed on the word lines. Since the (n−1)-th to (n+1)-th memory blocks BLK(n−1) to BLK(n+1) may be distinguished from each other by the slits SLT, gate lines included in different memory blocks may be separated from each other by the slits SLT. For example, gate lines included in the (n−1)-th memory block BLK(n−1) may be separated from gate lines included in the n-th memory block BLKn through the corresponding slit SLT.

The structures of the main plugs Pm and the separation patterns SP will be described in detail below.

Figure 5:
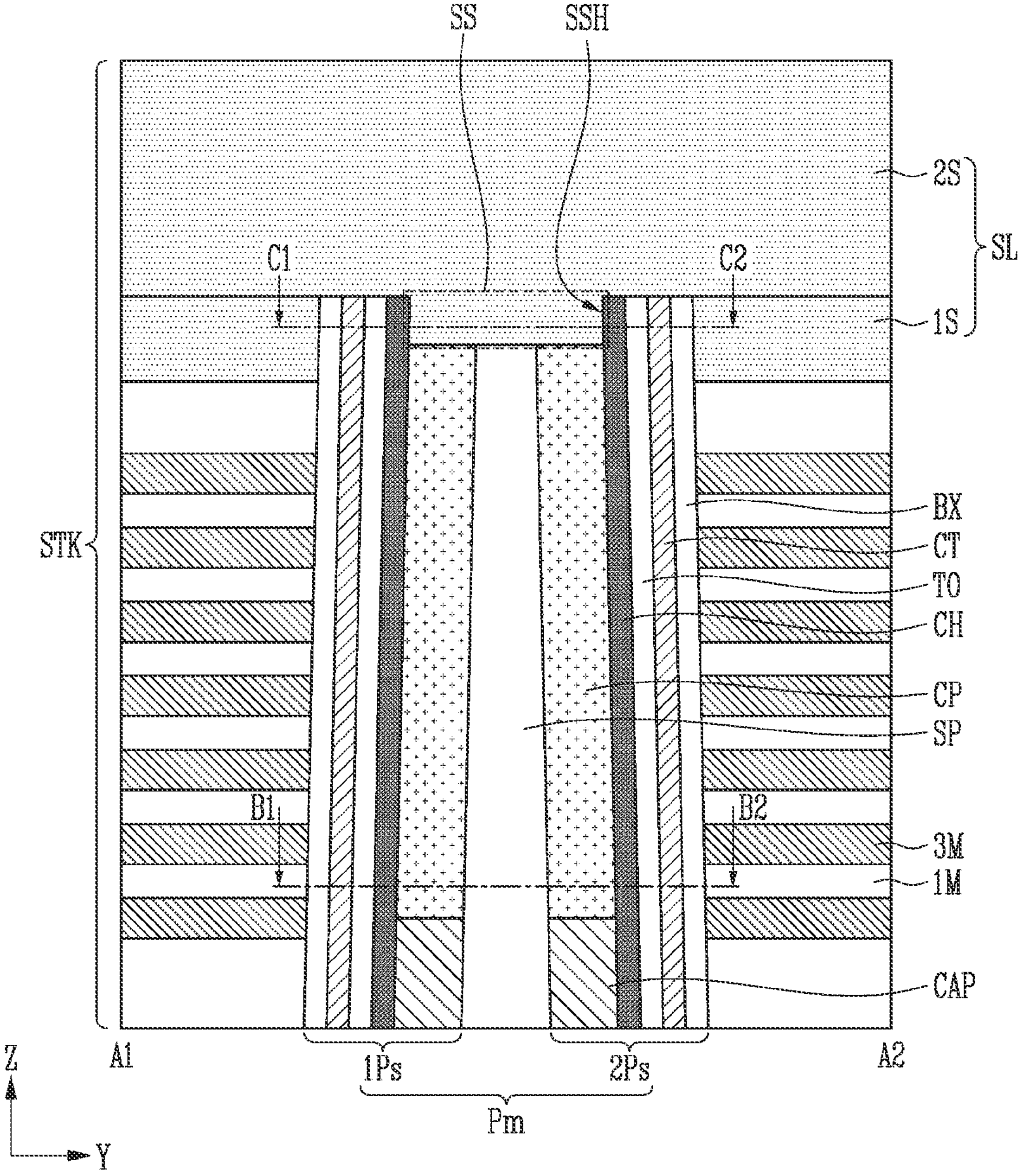
FIG. 5 is a cross-sectional view illustrating the structure of a memory block according to still another embodiment of the present disclosure.

FIG. 5 is a cross-sectional view illustrating the structure of a memory block according to one embodiment of the present disclosure.

Referring to FIG. 5, the memory block according to this embodiment of the present disclosure may include a separation pattern SP, a main plug Pm, first material layers 1M, third material layers 3M, and a source line SL. The main plug Pm and the source line SL may be disposed such that the main plug Pm overlaps the source line SL in a vertical direction (e.g., Z direction) of a stacked structure STK.

A sub-source layer hole SSH (filled with a sub-source layer SS) may be formed in an area overlapping the main plug Pm in a direction in which the main plug Pm is closer to the source line SL (e.g., Z direction). A sidewall of the sub-source layer hole SSH may be formed to contact an inner wall of the channel layer CH of the main plug Pm. Also, a bottom surface of the sub-source layer hole SSH may be formed to contact a top surface of a core pillar CP and a top surface of the separation pattern SR The sub-source layer hole SSH may be disposed to be spaced apart from the first source layer 1S with portions of the channel layer CH, the tunnel insulating layer TO, the charge trap layer CT and blocking layer BX of the main plug Pm interposed therebetween.

The source line SL may include the first source layer 1S and a second source layer S2. The first source layer 1S may be formed under the second source layer 2S while neighboring the second source layer 2S. The first source layer 1S may contact the second source layer 2S in the Z direction at the same height in the Z direction as a portion in which the channel layer CH, the tunnel insulating layer TO, the charge trap layer CT, and the blocking layer BX of the main plug Pm contact the second source layer 2S in the Z direction. For example, the first source layer 1S may be formed such that the main plug Pm contacts the second source layer 2S in the Z direction, which is the vertical direction of the stacked structure STK, and such that an inner wall of the first source layer 1S contacts an outer wall of the main plug Pm. Therefore, the first source layer 1S may be disposed to be spaced apart from the second source layer 2S in the Y direction, with the channel layer CH, the tunnel insulating layer TO, the charge trap layer CT and blocking layer BX of the main plug Pm interposed therebetween.

In the present embodiment, a portion filling the sub-source layer hole SSH, among portions of the second source layer 2S, may be defined as a sub-source layer SS. Because the sub-source layer SS fills the sub-source layer hole SSH, it may be formed in a shape protruding in the Z direction which is from the second source layer 2S to the capping layer CAP of the main plug Pm. Therefore, the thickness of the sub-source layer SS may be equal to the height of the sub-source layer hole SSH, and the width of the sub-source layer SS may be equal to the diameter of the sub-source layer hole SSH. An outer wall of the sub-source layer SS may contact the inner wall of the channel layer CH of the main plug Pm, and the bottom surface of the sub-source layer SS may be formed to contact the top surface of the core pillar CP of the main plug Pm and the top surface of the separation pattern SP. The sub-source layer SS may be disposed to be spaced apart from the first source layer 1S in the Y direction, with portions of the channel layer CH, the tunnel insulating layer TO, the charge trap layer CT and blocking layer BX of the main plug Pm interposed therebetween.

First material layers 1M and third material layers 3M may be stacked in the Z direction and alternately disposed adjacent to each other under the first source layer 1S. The first material layers 1M may be disposed in a lowermost portion and an uppermost portion of a structure in which the first material layers 1M and the third material layers 3M are stacked. Because each of the first material layers 1M is used as an insulating layer, it may be formed of an insulating material. For example, each of the first material layers 1M may be formed of an oxide layer or a silicon oxide layer, Because the third material layers 3M are used as gate lines, each of the third material layers 3M may be formed of a conductive material. For example, each of the third material layers 3M may be formed of a polysilicon layer.

The main plug Pm may include the capping layer CAP, the core pillar CP, the channel layer CH, the tunnel insulating layer TO, the charge trap layer CT, and the blocking layer BX. The capping layer CAP may be formed under the core pillar CP in a first direction (e.g., Z direction) of the main plug Pm formed in a vertical direction from the substrate and in a direction farther away from the source line SL, and may be used to improve the electrical characteristics of drain selection transistors. For example, the capping layer CAP may be formed of a conductive material. For example, the capping layer CAP may be formed of a doped polysilicon layer. The core pillar CP may be formed on the capping layer CAP. For example, the core pillar CP may be formed of an insulating material or a conductive material. The channel layer CH may be formed to enclose the capping layer CAP and the core pillar CP, and may be made of a semiconductor material. For example, the channel layer CH may be formed of a polysilicon layer. The tunnel insulating layer TO may be formed to enclose the channel layer CH, and may be made of an insulating material. For example, the tunnel insulating layer TO may be formed of an oxide layer or a silicon oxide layer. The charge trap layer CT may be formed to enclose the tunnel insulating layer TO, and may be made of a material capable of trapping charges. For example, the charge trap layer CT may be formed of a nitride layer. The blocking layer BX may be formed to enclose the charge trap layer CT, and may be made of an insulating material. For example, the blocking layer BX may be formed of an oxide layer or a silicon oxide layer.

The main plug Pm may be separated into sub-plugs 1Ps and 2Ps by the separation pattern SR The first and second sub-plugs 1Ps and 2Ps may be disposed to be spaced apart from each other with the separation pattern SP interposed therebetween. The first and second sub-plugs 1Ps and 2Ps and the separation pattern SP may be formed to extend along the vertical direction of the stacked structure STK, thus contacting the source line SL in the vertical direction (e.g., Z direction). For example, the blocking layer BX, the charge trap layer CT, the tunnel insulating layer TO, and the channel layer CH of the main plug Pm may contact the second source layer 2S except for the sub-source layer SS. The core pillar CP of the main plug Pm may contact the sub-source layer SS in a vertical direction, and the separation pattern SP may contact the sub-source layer SS in a vertical direction.

Because the inner surface of the channel layer CH contacts the source line SL through the sub-source layer SS, an area in which the channel layer CH contacts the source line SL may increase, and thus source resistance may decrease.

Figure 6A:
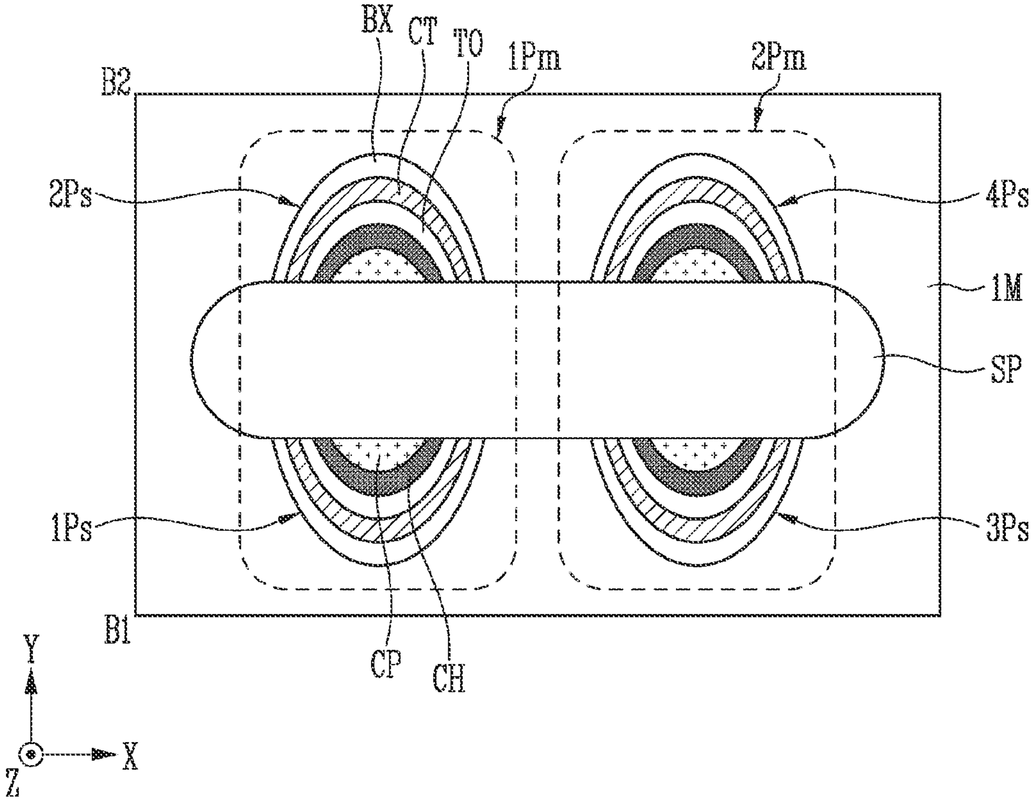
FIGS. 6A and 6B illustrate layouts for explaining the structure of a main plug Pm according to yet another embodiment of the present disclosure.
Figure 6B:
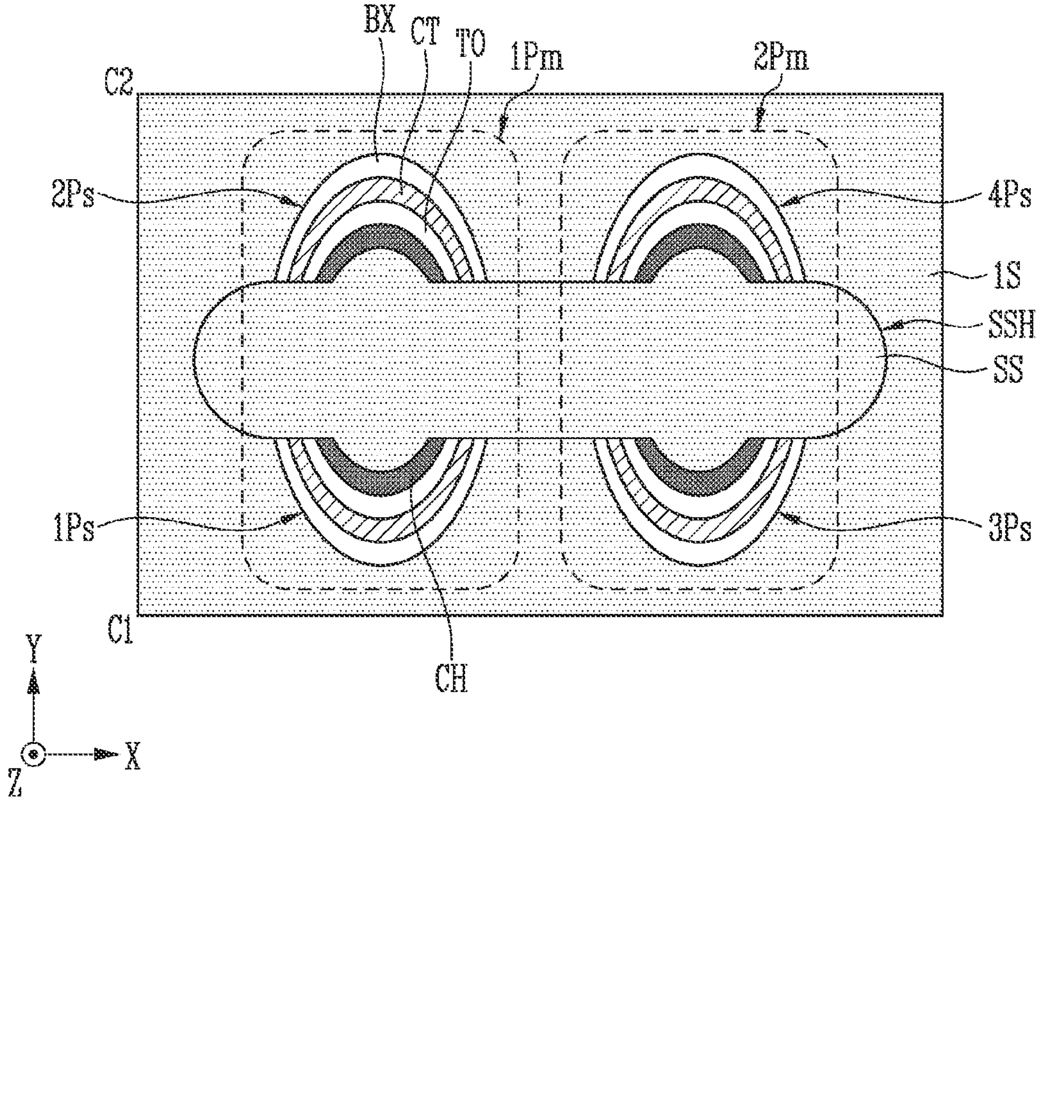

FIGS. 6A and 6B illustrate layouts for explaining the structure of a main plug Pm according to one embodiment of the present disclosure.

FIG. 6A illustrates the layout of FIG. 5 in direction B1-B2, and FIG. 6B illustrates the layout of FIG. 5 in direction C1-C2.

Referring to FIGS. 5 and 6A, first and second main plugs 1Pm and 2Pm and the separation pattern SP may be formed in a lower area of a memory block according to this embodiment of the present disclosure. The first and second main plugs 1Pm and 2Pm may be arranged in an X direction to be spaced apart from each other, and the separation pattern SP may be configured to extend in the X direction. By the separation pattern SP, the first main plug 1Pm may be separated into first and second sub-plugs 1Ps and 2Ps, and the second main plug 2Pm may be separated into third and fourth sub-plugs 3Ps and 4Ps. The first and third sub-plugs 1Ps and 3Ps may be formed to have the same structure, and the second and fourth sub-plugs 2Ps and 4Ps may be formed to have the same structure. The structure of the first sub-plug 1Ps may be symmetrical to that of the second sub-plug 2Ps with respect to the separation pattern SP, and the structure of the third sub-plug 3Ps may be symmetrical to that of the fourth sub-plug 4Ps with respect to the separation pattern SR Each of the first to fourth sub-plugs 1Ps, 2Ps, 3Ps, and 4Ps may include a blocking layer BX, a charge trap layer CT, a tunnel insulating layer TO, a channel layer CH, and a core pillar CR A first material layer 1M may be disposed outside the first and second main plugs 1Pm and 2Pm.

Referring to FIGS. 5 and 6B, a sub-source layer hole SSH may be formed to overlap the first and second main plugs 1Pm and 2Pm. The sub-source layer hole SSH may be formed to have the same width and area as the separation pattern SP, but a portion of the sub-source layer hole SSH may be formed to be enclosed by portions of the channel layers CH of the first and second main plugs 1Pm and 2Pm. Thus, the sub-source layer hole SSH may be formed in a protruding structure to contact the channel layers CH of the first and second main plugs 1Pm and 2Pm. For example, the sub-source layer hole SSH may be formed to protrude to the channel layers CH of the first and second sub-plugs 1Ps and 2Ps compared to the width of the separation pattern SP so as to contact the channel layers CH. Therefore, in the structure in which two main plugs 1Pm and 2Pm are separated by one separation pattern SP, as in the case of the present embodiment, the four sub-plugs 1Ps to 4Ps include respective protrusions of the sub-source layer hole SSH, and thus the sub-source layer hole SSH may have a total of four protrusions. The sub-source layer SS may be formed along the inside of the sub-source layer hole SSH.

By the sub-source layer 55, the first main plug 1Pm may be separated into first and second sub-plugs 1Ps and 2Ps, and the second main plug 2Pm may be separated into third and fourth sub-plugs 3Ps and 4Ps. The first and third sub-plugs 1Ps and 3Ps may be formed to have the same structure, and the second and fourth sub-plugs 2Ps and 4Ps may be formed to have the same structure. The structure of the first sub-plug 1Ps may be symmetrical to that of the second sub-plug 2Ps with respect to the sub-source layer 55, and the structure of the third sub-plug 3Ps may be symmetrical to that of the fourth sub-plug 4Ps with respect to the sub-source layer SS.

Because the structures of the first to fourth sub-plugs 1Ps, 2Ps, 3Ps, and 4Ps are formed to be similar to each other, the structure of the first sub-plug 1Ps, among the plurality of sub-plugs, is described below by way of example. The first sub-plug 1Ps may be formed such that the channel layer CH of the first sub-plug 1Ps encloses the protrusion of the sub-source layer SS, the tunnel insulating layer TO encloses the channel layer CH, the charge trap layer CT encloses the tunnel insulating layer TO, and the blocking layer BX encloses the charge trap layer CT. A first source layer 1S may be disposed outside the first and second main plugs 1Pm and 2Pm.

FIGS. 7A to 7K are cross-sectional views illustrating a method of manufacturing a memory device according to another embodiment of the present disclosure.

Figure 7A:
FIGS. 7A to 7K are cross-sectional views illustrating a method of manufacturing a memory device according to one embodiment of the present disclosure.

Referring to FIG. 7A, a first source layer 1S may be stacked on a lower structure. The lower structure may be a substrate or a structure including peripheral circuits. Because the first source layer 1S is a layer used as a source line, it may be formed of a conductive material. For example, the first source layer 1S may be formed of a conductive material, such as polysilicon, tungsten, or nickel.

Figure 7B:
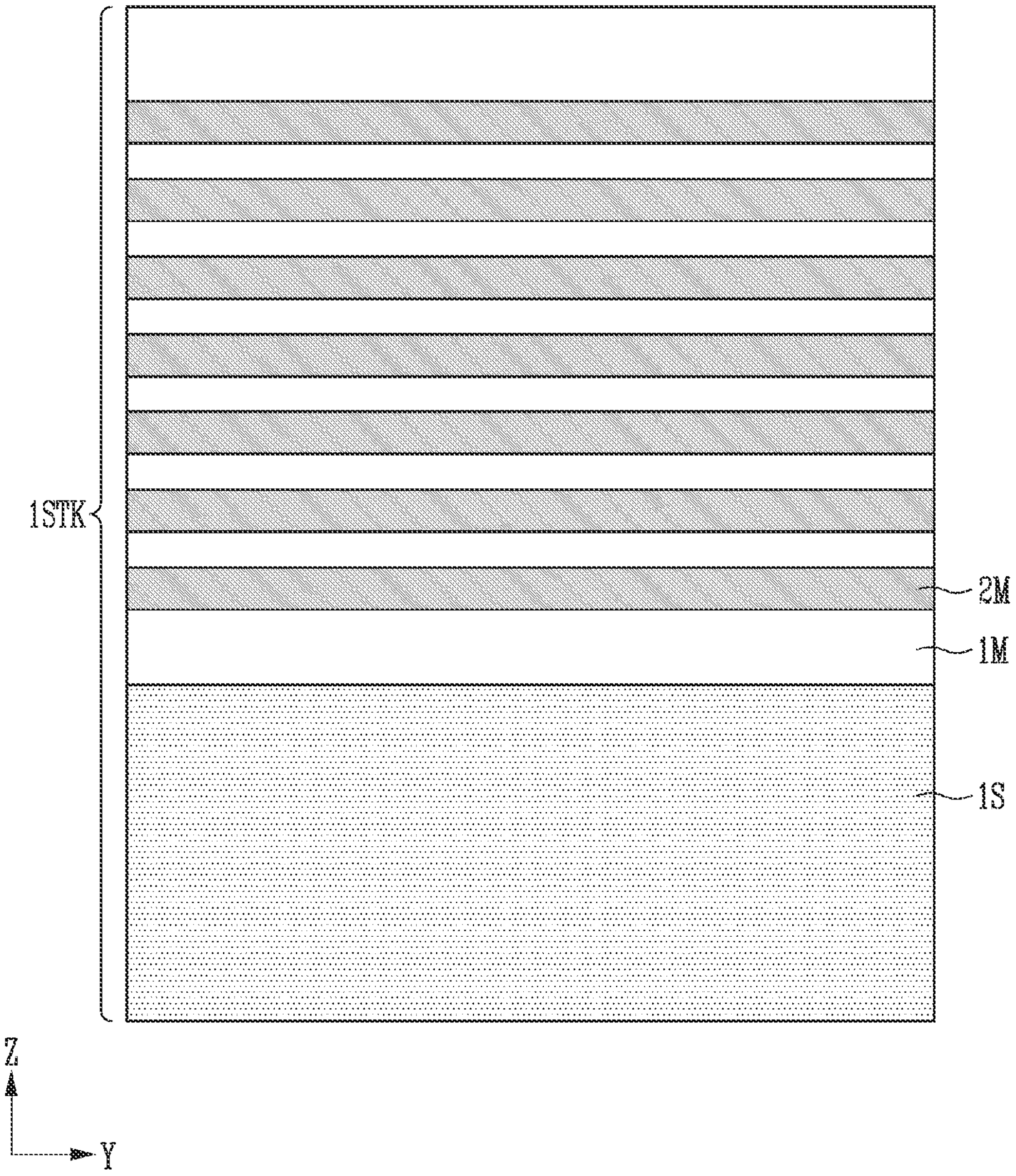

Referring to FIG. 7B, first and second material layers 1M and 2M may be alternately stacked on the first source layer 1S. For example, when a first material layer 1M is formed on the first source layer 1S, a second material layer 2M may be formed on the first material layer 1M, and a first material layer 1M may be formed again on the second material layer 2M. Each of the first material layers 1M may be formed of an insulating material. For example, each of the first material layers 1M may be formed of an oxide layer or a silicon oxide layer. Each of the second material layers 2M may be formed of a material that can be selectively removed in a subsequent process. Therefore, the second material layers 2M may be formed of a material having an etch selectivity different from that of the first material layers 1M, For example, each of the second material layers 2M may be formed of a nitride layer. In a structure in which the first and second material layers 1M and 2M are stacked, the first material layers 1M may be formed in the lowermost portion and the uppermost portion of the structure. Thus, the first stacked structure 1STK may be formed.

Figure 7C:
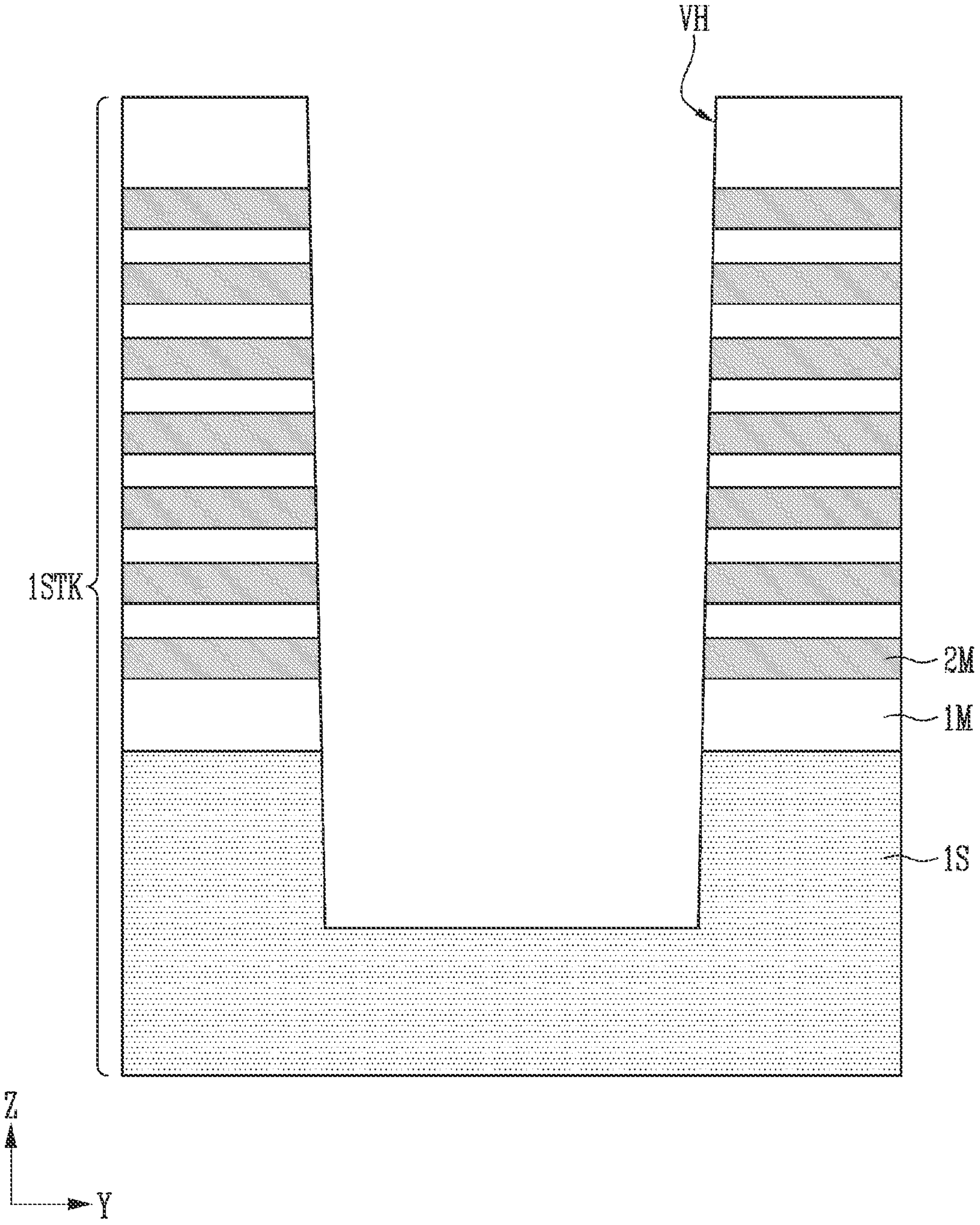

Referring to FIG. 7C, a vertical hole VH for exposing the first source layer 1S may be formed. The vertical hole VH may be tapered as shown in FIG. 7C. For example, an etching process of removing portions of the first and second material layers 1M and 2M and an etching process of removing a portion of the first source layer 1S may be performed. The etching process may be performed as a dry etching process so that the vertical hole VH is formed in a direction vertical to the substrate. The vertical hole VH may be formed in an area in which a main plug is to be formed. The major axis of the vertical hole VH is parallel to Y direction, and the minor axis thereof is parallel to X direction. When the etching process of forming the vertical hole VH is terminated, the first source layer is may be exposed through a bottom surface of the vertical hole VH, and the first source layer is and the first and second material layers 1M and 2M may be exposed through a side surface of the vertical hole VH.

Figure 7D:
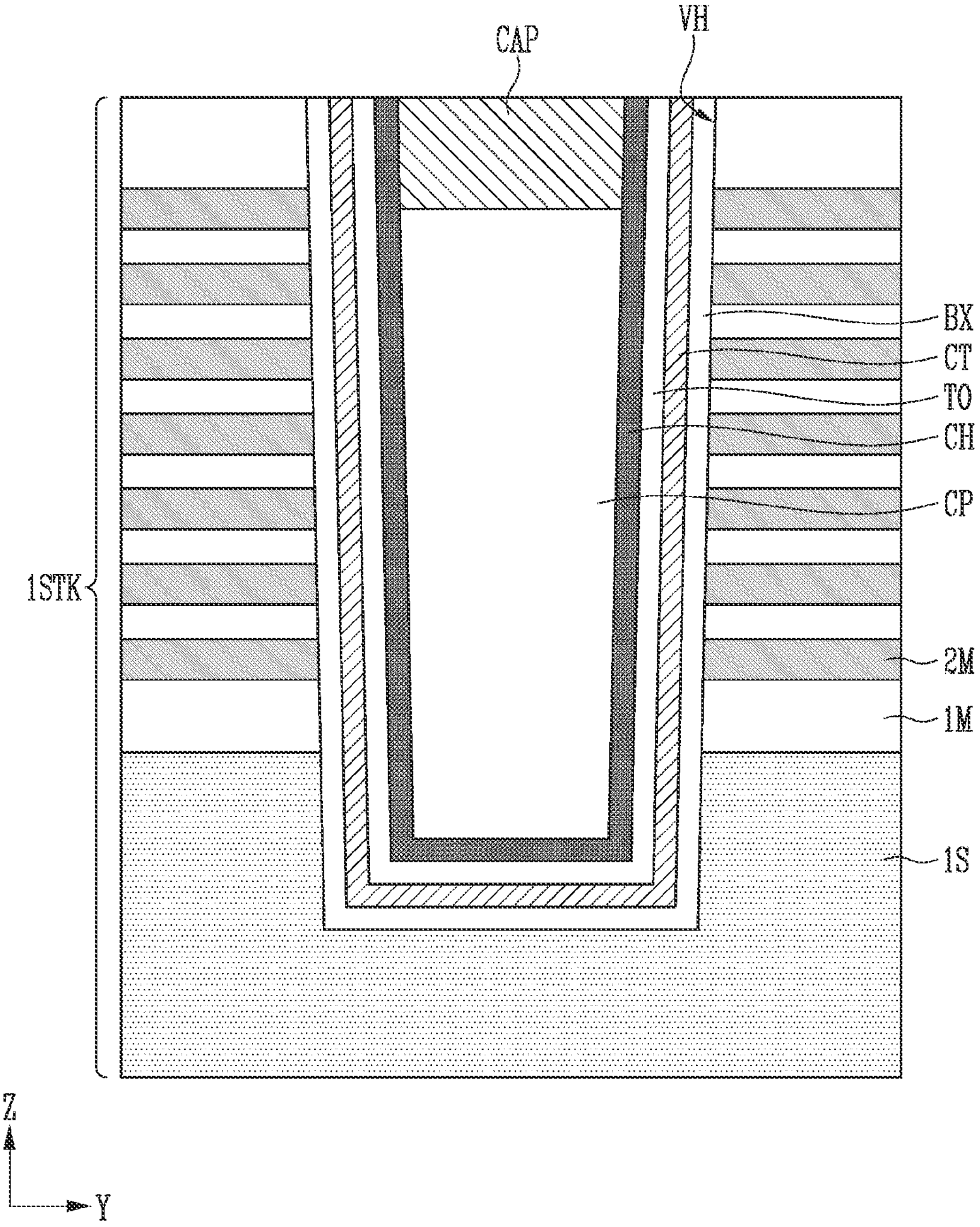

Referring to FIG. 7D, a main plug may be formed in the vertical hole VH. The main plug may include a blocking layer BX, a charge trap layer CT, a tunnel insulating layer TO, a channel layer CH, a core pillar CP, and a capping layer CAP. For example, the blocking layer BX may be formed along an inner surface of the vertical hole VH, Because the blocking layer BX does not fill the vertical hole VH, the blocking layer BX may be formed in a cylindrical shape. Subsequently, the charge trap layer CT may be formed along an inner surface of the blocking layer BX, and the tunnel insulating layer TO may be formed along an inner surface of the charge trap layer CT. The channel layer CH may be formed along an inner surface of the tunnel insulating layer TO, and an internal space enclosed by the channel layer CH may be filled with the core pillar CR After the core pillar CP is formed, an etching process of removing a portion of an upper area of the core pillar CP may be performed, and the capping layer CAP may be formed in an area from which the core pillar CP is removed.

Figure 7E:
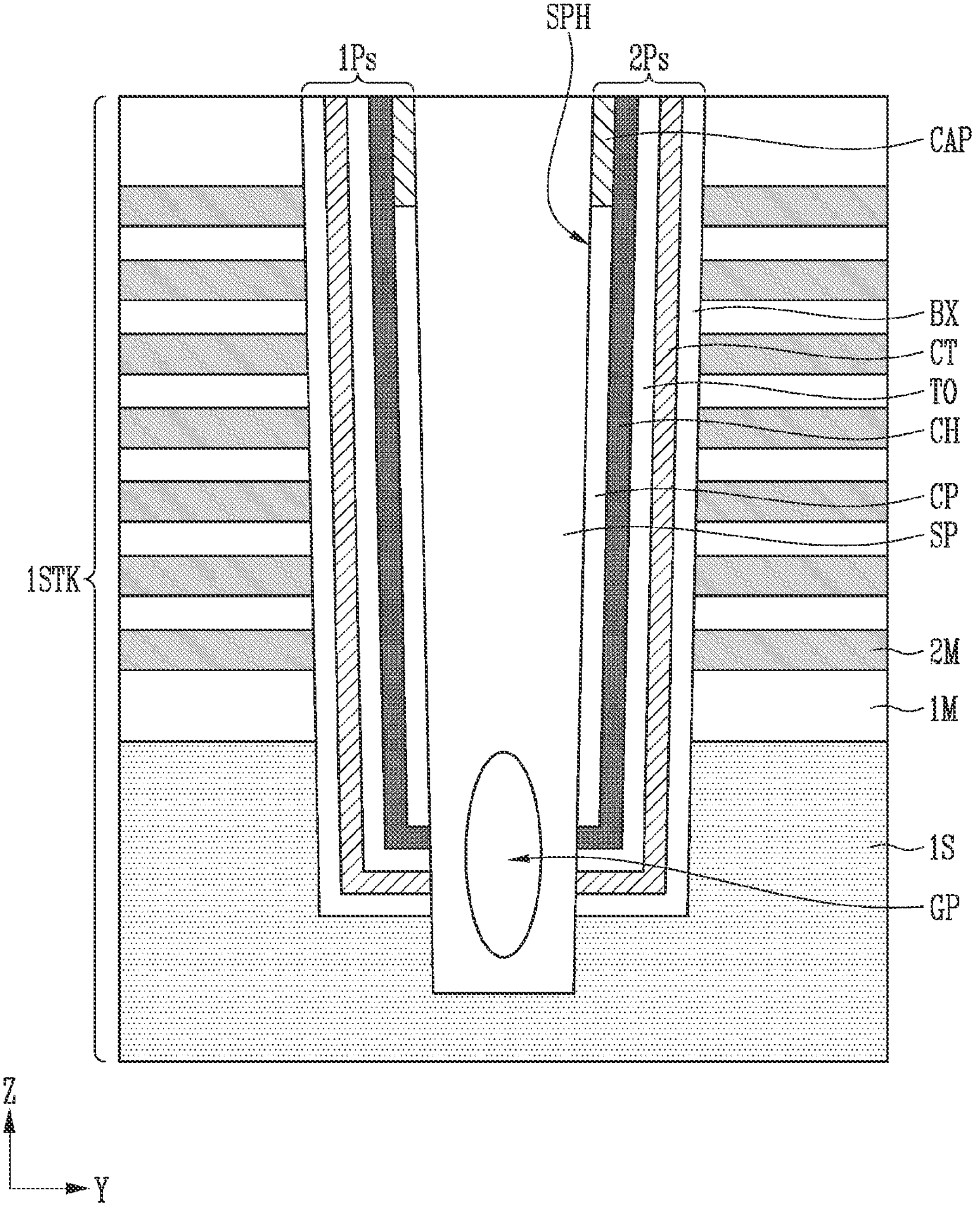

Referring to FIG. 7E, in order to separate the main plug in a Y direction, a separation pattern hole SPH may be formed by etching the first stacked structure 1STK in the Z direction such that the first source layer 1S is exposed through the bottom surface of the separation pattern hole SPH, and a separation pattern SP may be formed in the separation pattern hole SPH, The separation pattern SP may be formed of an insulating material so that the channel layers CH of the first and second sub-plugs 1Ps and 2Ps are electrically isolated from each other. For example, the separation pattern SP may be formed of an oxide layer or a silicon oxide layer. When a process of forming the separation pattern SP along the inside of the separation pattern hole SPH is performed, the separation pattern hole SPH is not completely filled with an insulating material, and thus an air gap GP may be formed.

Figure 7F:
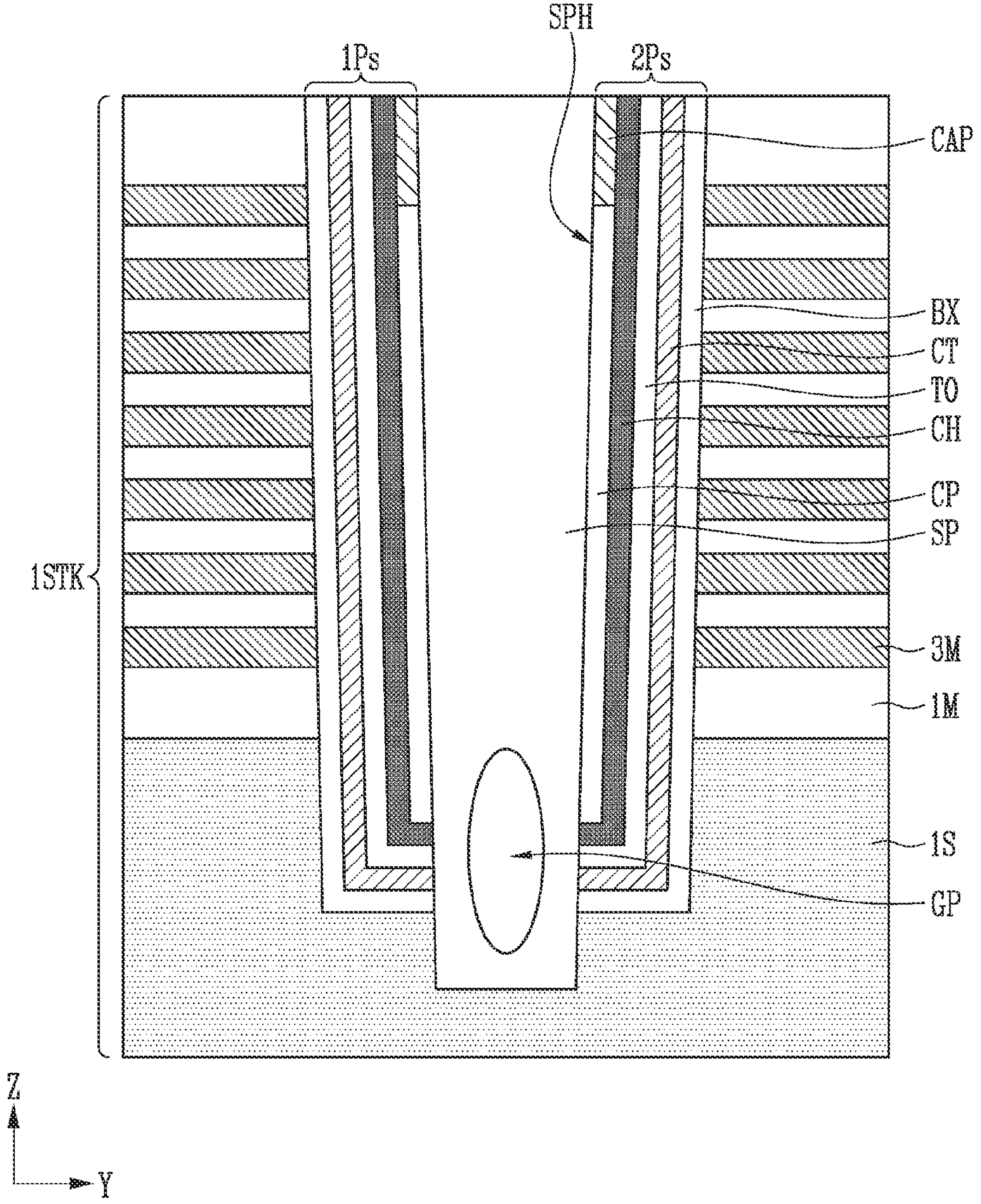

Referring to FIG. 7F, second material layers of FIG. 7E (i.e., 2M of FIG. 7E) may be removed, and third material layers 3M may be formed in areas from which the second material layers (e.g., 2M of FIG. 7E) are removed. In detail, an etching process of removing the second material layers (e.g., 2M of FIG. 7E) may be performed through a trench-type slit. The etching process may be performed as a wet etching process using etchant, which allows the first material layers 1M to remain and selectively removes the second material layers (i.e., 2M of FIG. 7E). In the areas from which the second material layers (2M of FIG. 7E) are removed, the third material layers 3M may be formed. For example, the third material layers 3M may be formed between the first material layers 1M through the trench-type slit. Because the third material layers 3M are used as gate lines, they may be made of a conductive material. For example, each of the third material layers 3M may be made of tungsten (W), cobalt (Co), nickel (Ni), molybdenum (Mo), silicon (Si), polysilicon (poly-Si), or the like.

Figure 7G:
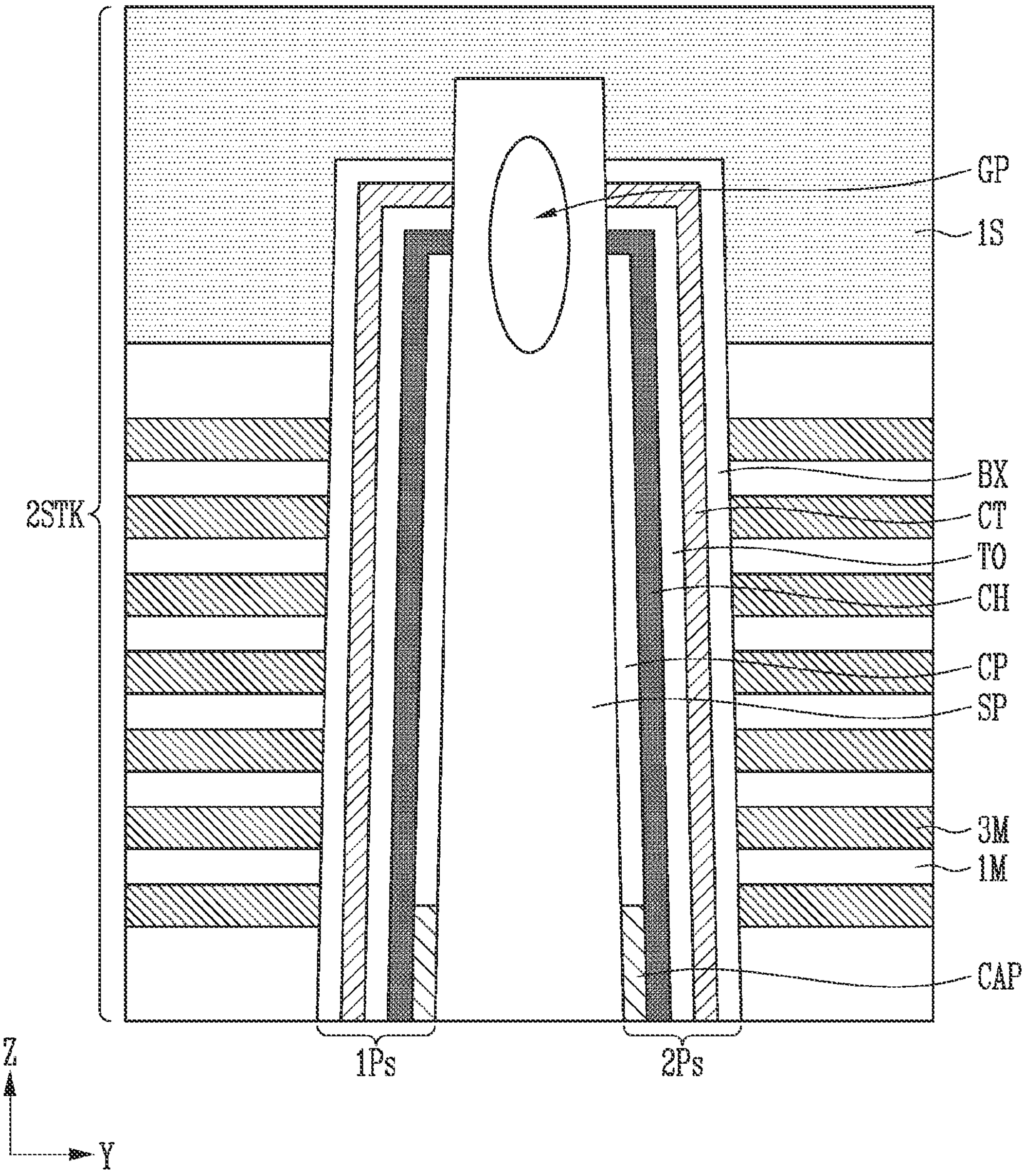

Referring to FIG. 7G, a process of turning the first stacked structure of FIG. 7F (e.g., 1STK of FIG. 7F) upside down may be performed. Hereinafter, the upside-down first stacked structure may be defined as a second stacked structure 2STK. Because a structure obtained by turning the first stacked structure upside down is the second stacked structure 2STK, the first source layer 1S in the second stacked structure 2STK may be disposed in an uppermost portion of the second stacked structure 2STK and the first material layer 1M may be disposed in a lowermost portion of the second stacked structure 2STK. Further, a peripheral circuit structure may be disposed on the first source layer 1S. Because the first source layer 1S is disposed on the second stacked structure 2STK, a portion in which the first source layer 1S contacts the main plug Pm and the separation pattern SP may also be included in the upper portion of the second stacked structure 2STK. The air gap GP disposed in the separation pattern SP may also be disposed in the upper portion of the second stacked structure 2STK.

Figure 7H:
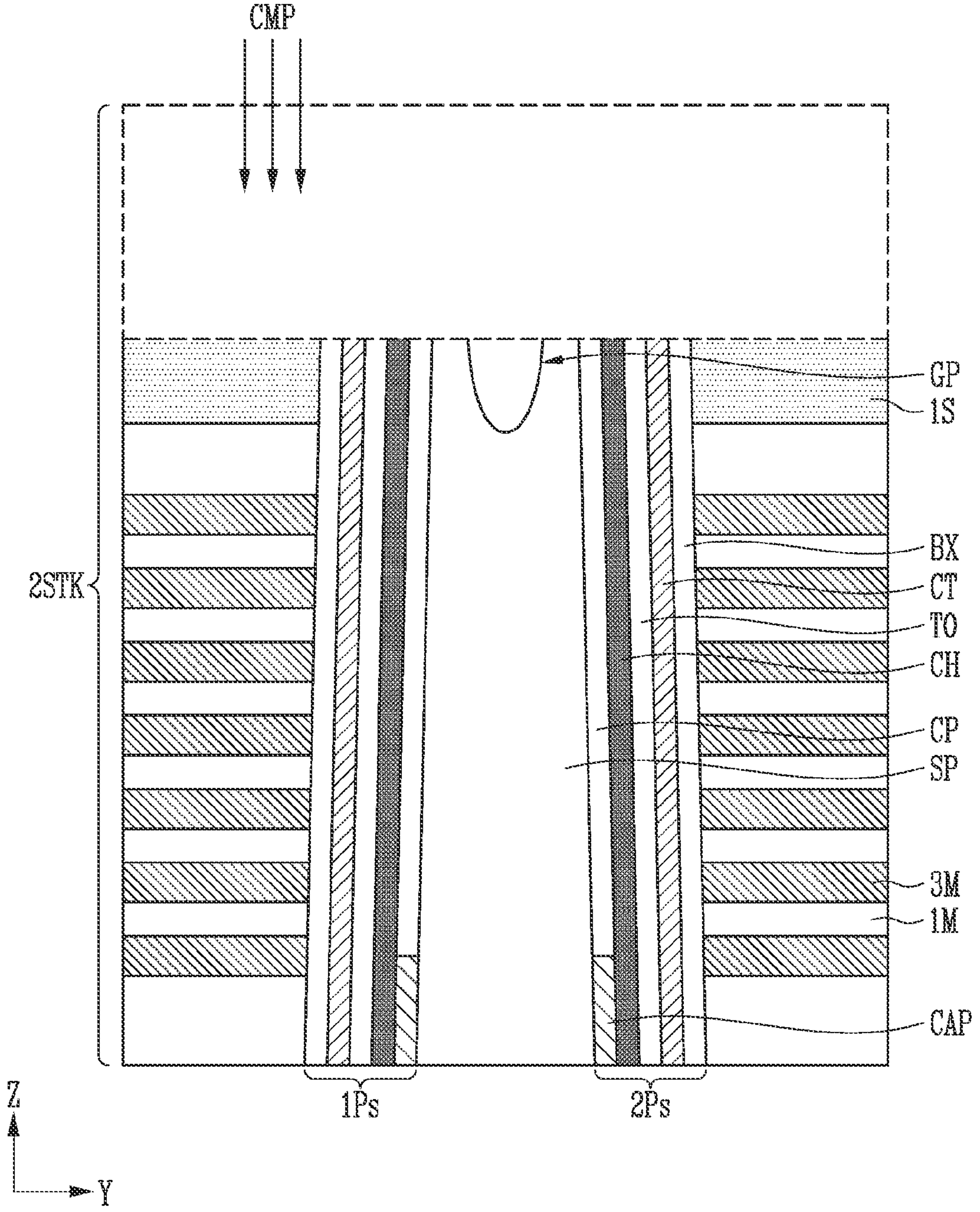

Referring to FIG. 7H, an etching process of exposing the channel layer CH and the air gap GP in the separation pattern SP by removing a portion of the first source layer 1S may be performed. When a peripheral circuit structure is formed on the first source layer 1S, the first source layer 1S may be etched after the corresponding peripheral circuit structure is removed. For example, the etching process may be performed as a chemical mechanical planarization (CMP) process for exposing the first source layer 1S and the air gap GP in the separation pattern SR When the planarization CMP is performed, a portion of the first source layer 1S and portions of upper areas of the main plug Pm and the separation pattern SP, which overlap the first source layer 1S, may be removed, and the air gap GP in the separation pattern SP may be exposed. When the planarization process is performed, the blocking layer BX, the charge trap layer CT, the tunnel insulating layer TO, the channel layer CH, and the core pillar CP, which are included in the main plug Pm, may be exposed through the etched top surface of the second stacked structure 2STK. Furthermore, the separation pattern SP and the air gap GP in the separation pattern SP may be exposed through the etched top surface of the second stacked structure 2STK.

Figure 7I:
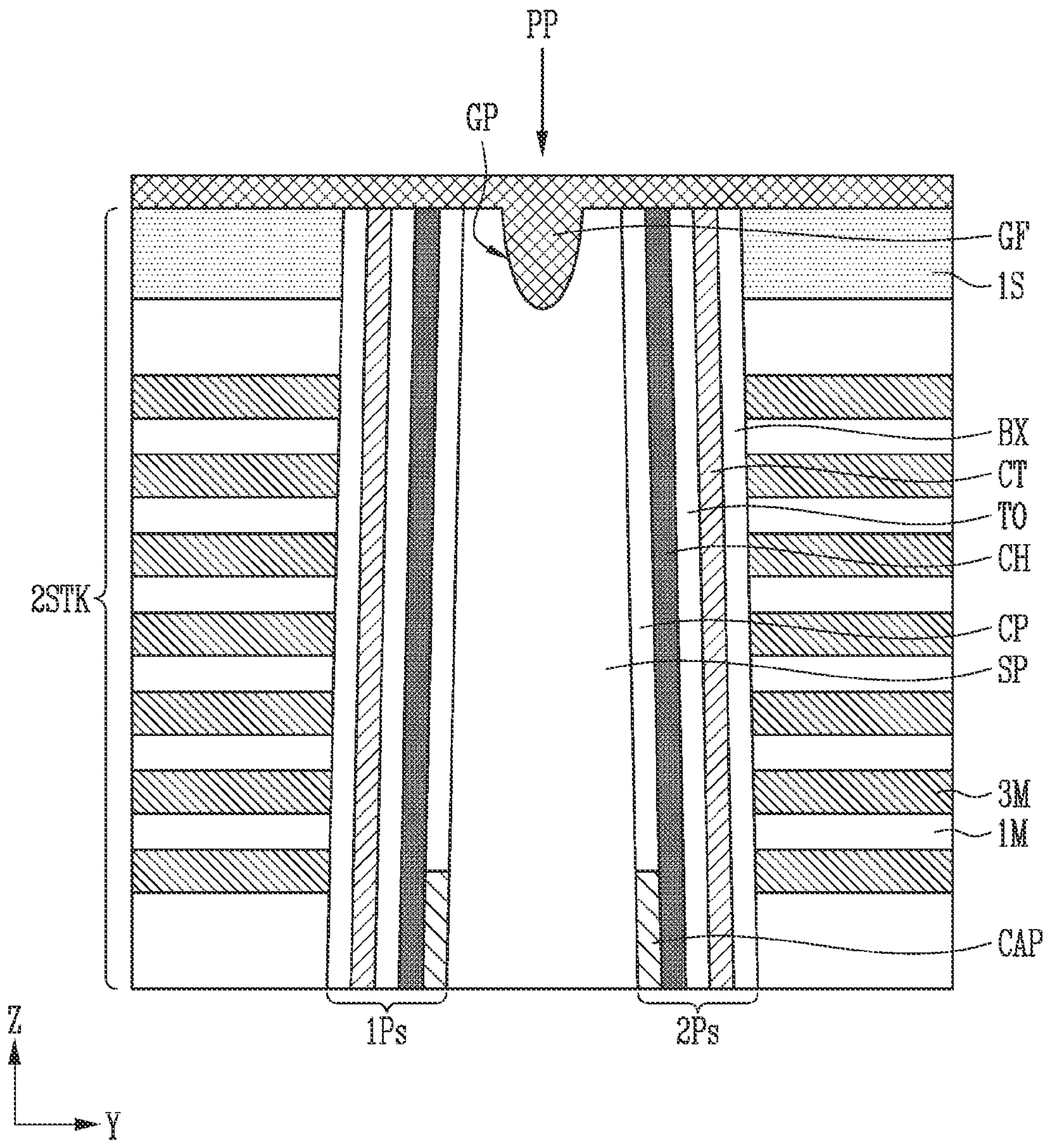
Figure 7J:
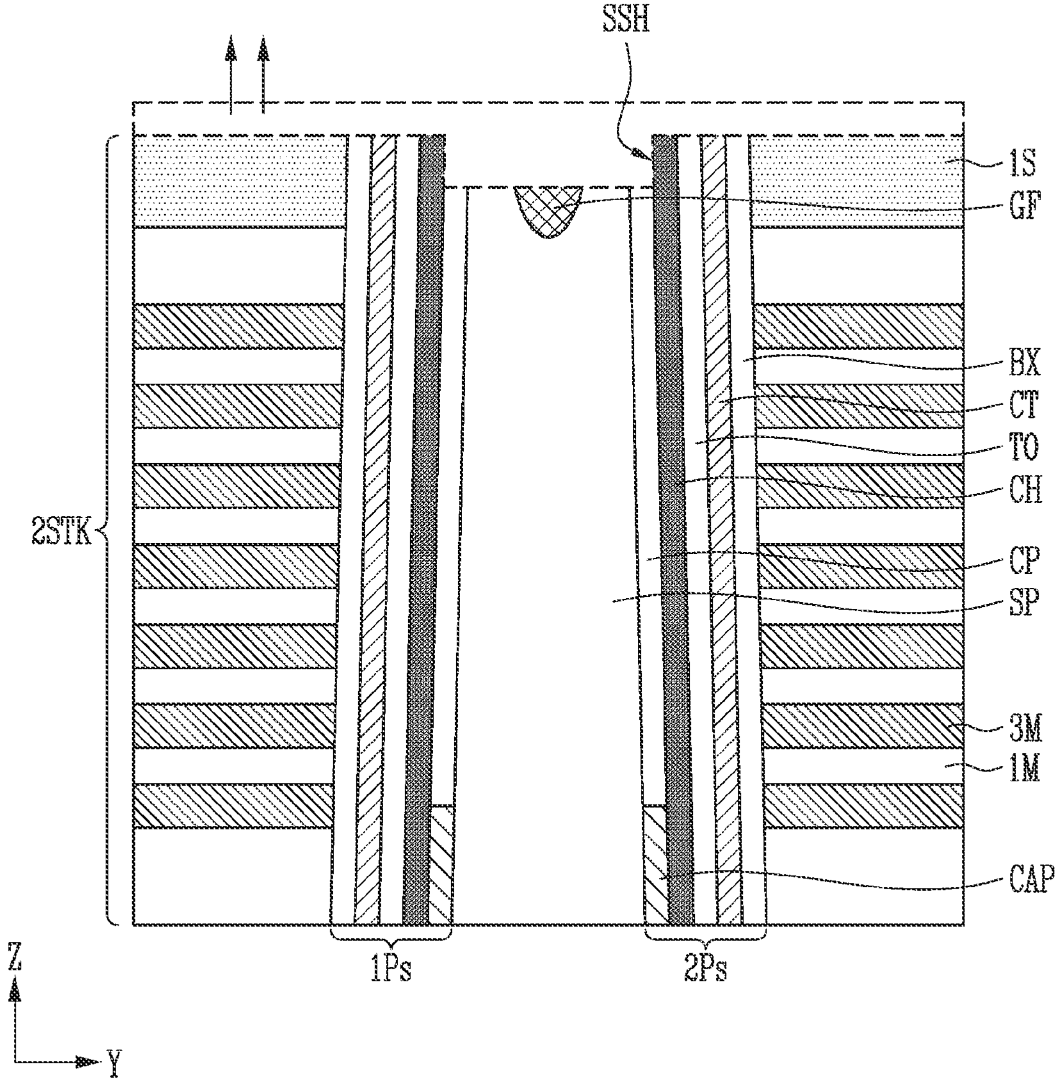

Referring to FIG. 7I, an oxidization process of filling the inside of the exposed air gap GP with a gap-fill layer GF may be performed. In the oxidization process of filling the inside of the air gap GP with the gap-fill layer GF, the gap-fill layer GF may also be formed on the top surface of the second stacked structure 2STK. The gap-fill layer GF may be formed of the same material as the separation pattern SP so that the channel layers CH of the first and second sub-plugs 1Ps and 2Ps are electrically isolated from each other. For example, when the separation pattern SP is formed of an oxide layer or a silicon oxide layer made of an insulating material, the gap-fill layer GF may also be formed of the oxide layer or the silicon oxide layer.

Referring to FIG. 73, an etching process of removing a portion of the gap-fill layer GF, and a portion of the core pillar CP of the main plug Pm and a portion of the separation pattern SP, which are disposed in an upper portion of the second stacked structure 2STK, may be performed. For example, the etching process may be performed as an etch-back process that is capable of selectively removing an oxide layer. The etch-back process may be performed until the gap-fill layer GF, the core pillar CP, and the separation pattern SP are removed to a certain depth. In this case, although upper portions of the blocking layer BX and the tunnel insulating layer TO, which are made of oxide, may be partially removed, an area exposed through the etch-back process is narrower than an area in which the core pillar CP and the separation pattern SP disposed at the center of the main plug Pm are exposed, and thus the amount of removal may be very small even if partial upper portions of the block layer BX and the tunnel insulting layer TO are removed. Portions of the core pillar CP and the separation pattern SP are removed, and thus a sub-source layer hole SSH may be formed in an area enclosed by the channel layer CH. For example, an outer surface of the sub-source layer hole SSH may be enclosed by the channel layer UI, and the gap-fill layer GF, the separation pattern SP, and the core pillar CP may be exposed through the bottom surface of the sub-source layer hole SSH.

Figure 7K:
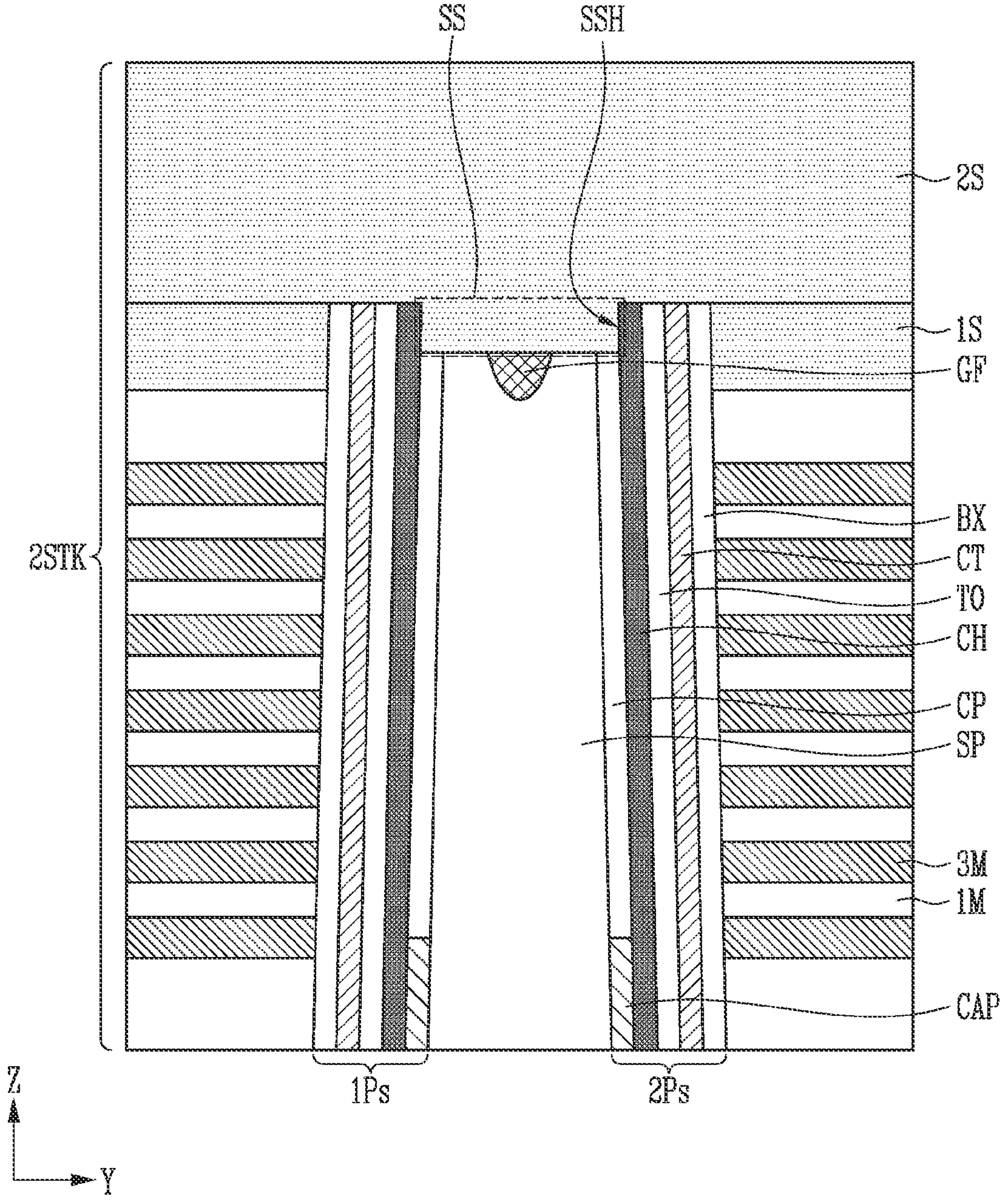

Referring to FIG. 7K, a second source layer 2S may be formed on the second stacked structure 2STK. In the present embodiment, a portion filling the sub-source layer hole SSH, among portions of the second source layer 2S, may be defined as a sub-source layer SS. The thickness of the sub-source layer SS may be equal to the height of the sub-source layer hole SSH, and the width of the sub-source layer SS may be equal to the diameter of the sub-source layer hole SSH. The second source layer 2S is formed, and thus a source line SL including the first and second source layers 1S and 2S and the sub-source layer SS may be formed.

Because the inner surface of the channel layer CH contacts the source line SL through the sub-source layer SS, an area in which the channel layer CH contacts the source line SL may increase, and thus source resistance may decrease.

Figure 8:
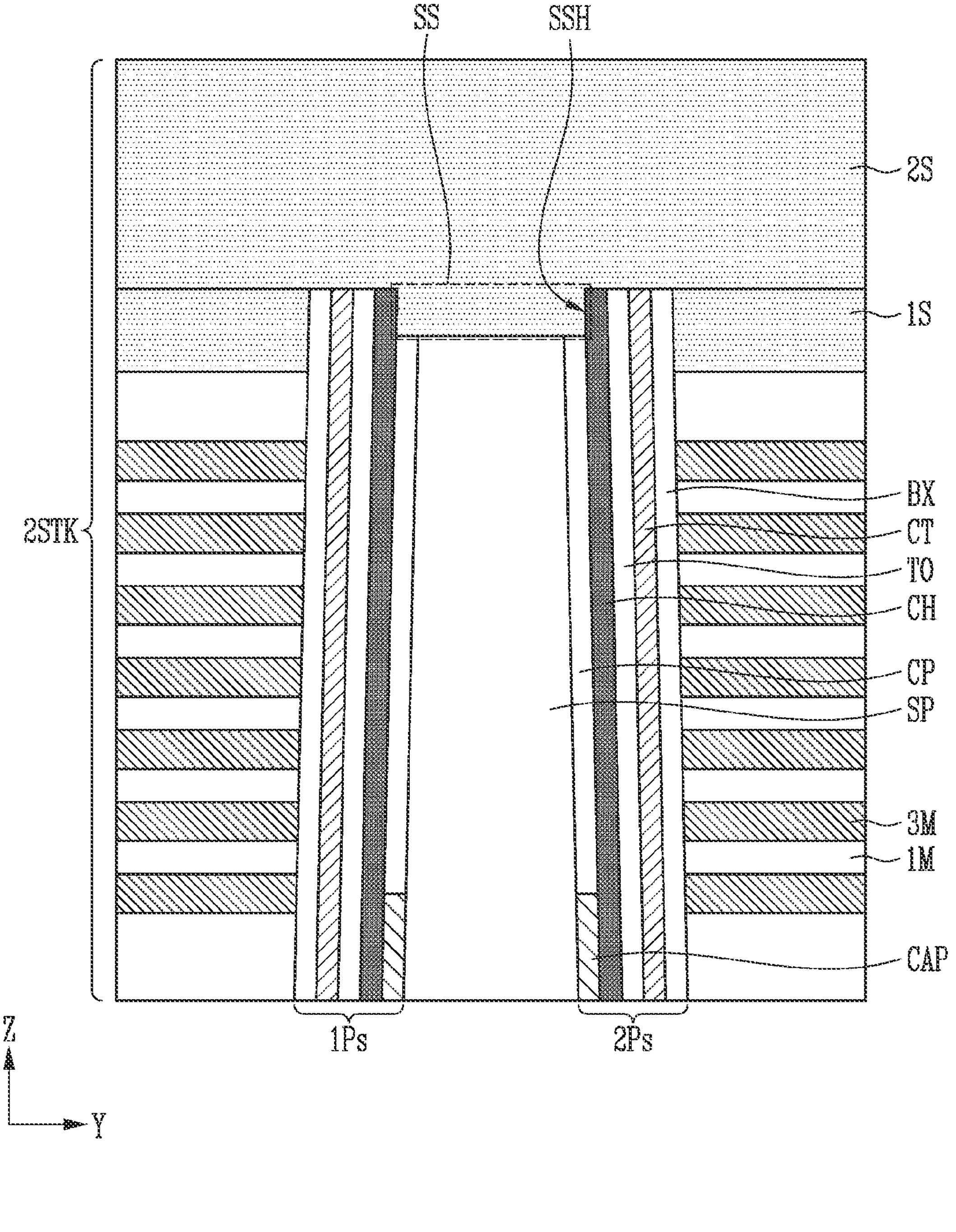
FIG. 8 is a cross-sectional view illustrating another embodiment of the present disclosure.

FIG. 8 is a cross-sectional view illustrating another embodiment of the present disclosure.

Referring to FIGS. 7G to 8, when the size of the air gap GP (GP of FIG. 7G) is smaller than a target depth of the planarization process of FIG. 7H(CMP of FIG. 7H), or when the location of the air gap of FIG. 7G (GP of FIG. 7G) is disposed higher than that of a target depth of the planarization process of FIG. 7H (CMP of FIG. 7H), the air gap of FIG. 7H (GP of FIG. 7H) may be removed in the planarization process of FIG. 7H (CMP of FIG. 7H). In this case, a process of forming the gap-fill layer (GF of FIG. 7I), described above with reference to FIG. 7I, may be skipped. That is, the process of forming the gap-fill layer of FIG. 7I (GF of FIG. 7I) may be selectively performed. For example, referring to FIGS. 7G and 73, immediately after an etching process of removing a portion of the first source layer 1S and exposing the first source layer 1S and the air gap of FIG. 7G (GP of FIG. 7G) in the separation pattern SP is performed, an etching process of forming the sub-source layer hole of FIG. 73 (SSI of FIG. 73) may be performed, and thus the second stacked structure 2STK of FIG. 8 may be formed.

Figure 9:
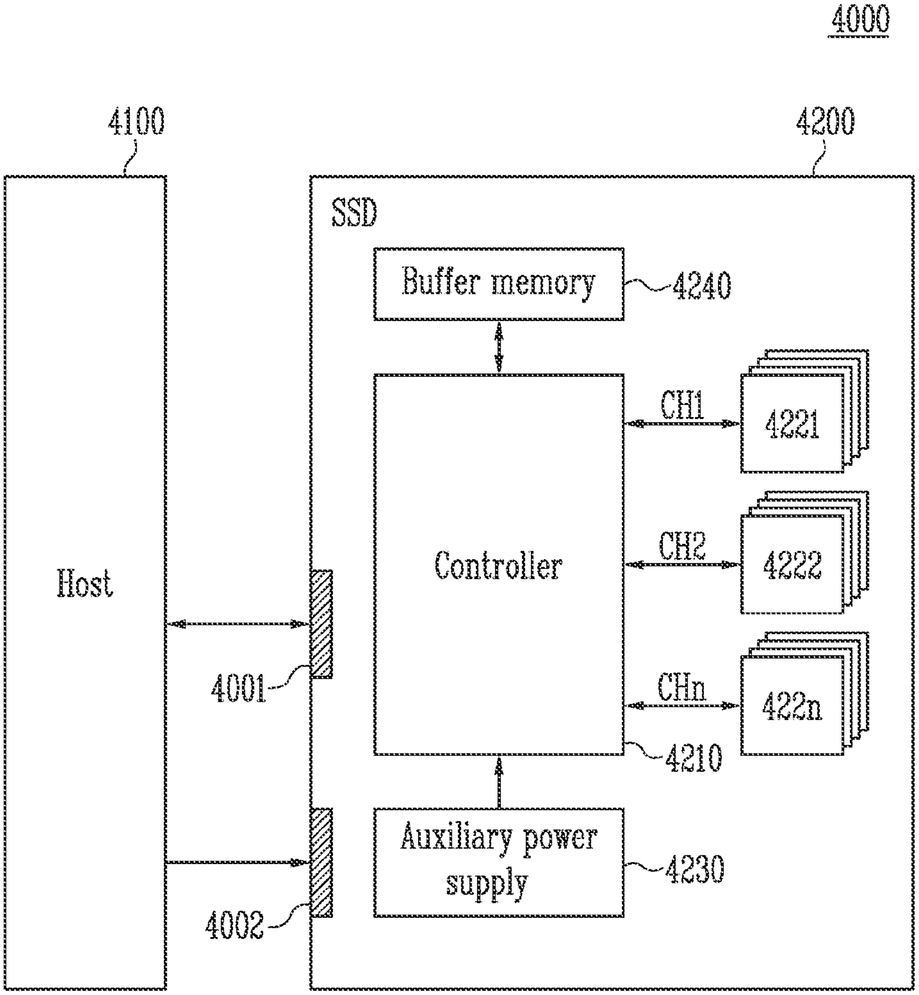
FIG. 9 is a diagram illustrating a solid state drive (SSD) system to which a memory device according to still another embodiment of the present disclosure is applied.

FIG. 9 is a diagram illustrating a solid state drive (SSD) system to which a memory device according to the present disclosure is applied.

Referring to FIG. 9, an SSD system 4000 may include a host 4100 and an SSD 4200. The SSD 4200 may exchange signals with the host 4100 through a signal connector 4001, and may receive power through a power connector 4002. The SSD 4200 may include a controller 4210, a plurality of memory devices 4221 to **422*n*, an auxiliary power supply 4230, and a buffer memory 4240**.

The controller 4210 may control the plurality of memory devices 4221 to **422*n* in response to signals received from the host 4100. In one embodiment, the signals may be transmitted based on the interfaces of the host 4100 and the SSD 4200**, For example, the signals may be defined by at least one of various interfaces such as universal serial bus (USB), multimedia card (MMC), embedded MMC (eMMC), peripheral component interconnection (PCI), PCI-express (PCI-E), advanced technology attachment (ATA), serial-ATA (SATA), parallel-ATA (DATA), small computer system interface (SCSI), enhanced small disk interface (ESDI), integrated drive electronics (IDE), Fire e, universal flash storage (UFS), WiFi, Bluetooth, and nonvolatile memory express (NVMe).

Each of the plurality of memory devices 4221 to **422*n* may include a plurality of memory cells configured to store data. Each of the memory devices 4221 to 422*n* may be configured in the same manner as the memory device 100 illustrated in FIG. 1. The plurality of memory devices 4221 to 422*n* may communicate with the controller 4210** through channels CH1 to CHn.

The auxiliary power supply 4230 may be coupled to the host 4100 through the power connector 4002. The auxiliary power supply 4230 may be supplied with a supply voltage from the host 4100, and may be charged. The auxiliary power supply 4230 may provide the supply voltage of the SSD 4200 when the supply of power from the host 4100 is not smoothly performed. In one embodiment, the auxiliary power supply 4230 may be located inside the SSD 4200 or located outside the SSD 4200. For example, the auxiliary power supply 4230 may be located in a main board, and may also provide auxiliary power to the SSD 4200.

The buffer memory 4240 may function as a buffer memory of the SSD 4200. For example, the buffer memory 4240 may temporarily store data received from the host 4100 or data received from the plurality of memory devices 4221 to 422*n*, or may temporarily store metadata (e.g., mapping tables) of the memory devices 4221 to 422*n*. The buffer memory 4240 may include volatile memories, such as a dynamic random access memory (DRAM), a synchronous DRAM (SDRAM), a double data rate (DDR) SDRAM, and a low power DDR (LPDDR) SDRAM, or nonvolatile memories, such as a ferroelectric RAM (FRAM), a resistive RAM (ReRAM), a spin transfer torque magnetic RAM (STT-MRAM), and a phase-change RAM (PRAM).

Figure 10:
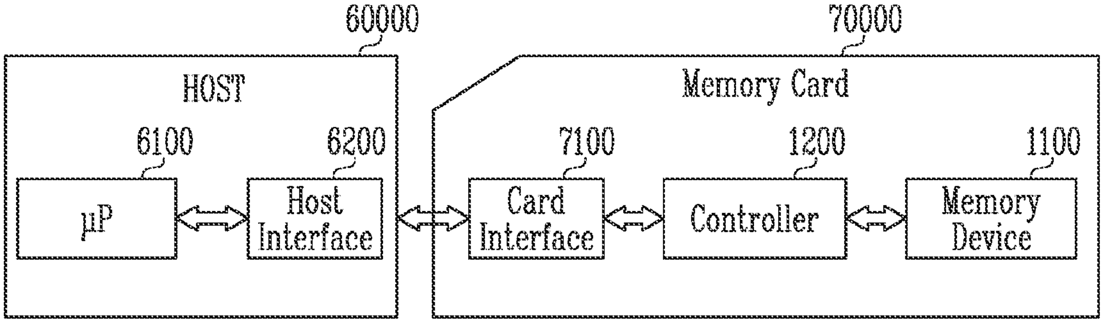
FIG. 10 is a diagram illustrating a memory card system to which a memory device according to yet another embodiment of the present disclosure is applied.

FIG. 10 is a diagram illustrating a memory card system to which a memory device according to the present disclosure is applied.

Referring to FIG. 10, a memory system 70000 may be implemented as a memory card or a smart card. The memory system 70000 may include a memory device 1100, a controller 1200, and a card interface 7100.

The memory device 1100 may be configured in the same manner as the memory device 100 illustrated in FIG. 1.

The controller 1200 may control data exchange between the memory device 1100 and the card interface 7100, In one embodiment, the card interface 7100 may be, but is not limited to, a secure digital (SD) card interface or a multimedia card (MMC) interface.

The card interface 7100 may interface data exchange between a host 60000 and the controller 1200 according to the protocol of the host 60000. In one embodiment, the card interface 7100 may support a universal serial bus (USB) protocol and an interchip (IC)-USB protocol. Here, the card interface 7100 may refer to hardware capable of supporting a protocol which is used by the host 60000, software installed in the hardware, or a signal transmission method.

When the memory system 70000 is coupled to a host interface 6200 of the host 60000 such as a PC, a tablet PC, a digital camera, a digital audio player, a mobile phone, console video game hardware, or a digital set-top box, the host interface 6200 may perform data communication with the memory device 1100 through the card interface 7100 and the controller 1200 under the control of a microprocessor (μP) 6100.

In accordance with the present disclosure, the degree of integration of a memory device may be improved.

What is claimed is:

1. A memory device comprising:

a stacked structure including a drain selection line, word lines, and a source selection line that are sequentially stacked;

a main plug extending through the stacked structure;

a separation pattern disposed between a first sub-plug and a second sub-plug within the main plug, wherein the first sub-plug and the second sub-plug are physically spaced apart from each other; and a source line stacked over the stacked structure, and comprising a sub source layer, wherein the sub source layer protrudes into a central portion of an upper area of the main plug.

2. The memory device according to claim 1, wherein:

the drain selection line is disposed in a lower portion of the stacked structure, and the source selection line is disposed in an upper portion of the stacked structure.

3. The memory device according to claim 1, wherein the main plug comprises a blocking layer, a charge trap layer, a tunnel insulating layer, a channel layer, a core pillar, and a capping layer that extend in the vertical direction.

4. The memory device according to claim 3, wherein a bottom surface of the sub-source layer contacts the core pillar of the main plug and the separation pattern.

5. The memory device according to claim 3, wherein a side surface of the sub-source layer contacts an inner surface of the channel layer.

6. The memory device according to claim 3, wherein the blocking layer of the main plug is enclosed by the source line.

7. The memory device according to claim 3, wherein:

the source line further comprises:

a first source layer disposed over the main plug and comprising the sub-source layer; and a second source layer disposed under the first source layer, wherein a boundary between the first source layer and the second source layer is at a same level as a portion at which the blocking layer, the charge trap layer, the tunnel insulating layer and the channel layer of the main plug contact the first source layer.

8. The memory device according to claim 7, wherein:

the second source layer and the sub source layer are spaced apart from each other with the blocking layer, the charge trap layer, the tunnel insulating layer and the channel layer interposed therebetween.

9. The memory device according to claim 7, wherein:

The first source layer is disposed on a structure in which insulating layers and conductive layers are alternately stacked in a direction of the first source layer.

10. The memory device according to claim 7, wherein:

The bottom surface of the sub source layer is formed at a higher level than a bottom surface of the first source layer.

11. The memory device according to claim 10, wherein:

the insulating layers comprise oxide layers or silicon oxide layers.

12. The memory device according to claim 10, wherein:

the conductive layers comprise polysilicon layers.

13. The memory device according to claim 3, wherein:

the capping layer is formed of a conductive material.

14. The memory device according to claim 1, wherein the first and second sub-plugs have structures symmetrical to each other with respect to the separation pattern.

15. The memory device according to claim 1, wherein the separation pattern is formed of an insulating material.

16. The memory device according to claim 1, further comprising: an air gap formed in the separation pattern; and a gap-fill layer configured to fill the air gap.

17. The memory device according to claim 16, wherein the gap-fill layer is formed of a material identical to that of the separation pattern.

18. A memory device comprising:

a stacked structure including a drain selection line, word lines, and a source selection line that are sequentially stacked;

a main plug extending through the stacked structure, and including a sub-source layer hole in a central portion of an upper area of the main plug;

a separation pattern disposed between a first sub-plug and a second sub-plug within the main plug, wherein the first sub-plug and the second sub-plug are physically spaced apart from each other;

a source line stacked over the stacked structure, and comprising a sub-source layer which fills the sub-source layer hole; and a blocking layer, a charge trap layer, a tunnel insulating layer, and a channel layer disposed adjacent the sub-source layer hole and extending in the vertical direction away from the sub-source layer, wherein the sub-source layer protrudes in a direction close to a bottom of the separation pattern and directly contacts the channel layer.

* * * * *